United States Patent
Mizutani et al.

(10) Patent No.: US 6,433,381 B2
(45) Date of Patent: Aug. 13, 2002

(54) SEMICONDUCTOR DEVICE AND METHOD OF MANUFACTURING THE SAME

(75) Inventors: Kazuhiro Mizutani; Michiari Kawano, both of Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 09/756,222

(22) Filed: Jan. 9, 2001

(30) Foreign Application Priority Data

Jul. 31, 2000 (JP) ........................................ 2000-232530

(51) Int. Cl.⁷ ............................................ H01L 27/108
(52) U.S. Cl. ..................... 257/311; 257/296; 257/306
(58) Field of Search ............................. 257/296, 298, 257/306, 311

(56) References Cited

U.S. PATENT DOCUMENTS

| | | | | |
|---|---|---|---|---|
| 6,020,644 A | * | 2/2000 | Tanigawa | 257/296 |
| 6,037,207 A | | 3/2000 | Asano et al. | 438/241 |
| 6,194,757 B1 | * | 2/2001 | Shinkawata | 257/296 |

FOREIGN PATENT DOCUMENTS

| | | | | |
|---|---|---|---|---|
| JP | 64036063 A | * | 2/1989 | ........... H01L/27/10 |
| JP | 10-27889 | | 1/1998 | |
| JP | 10-200075 | | 7/1998 | |
| JP | 10-223858 | | 8/1998 | |
| JP | 11-176773 | | 7/1999 | |

OTHER PUBLICATIONS

The Japan Society of Applied Physics, JSAP CAT. No. AP971308, IEEE CAT. No. 97 CH 36114, Jun. 10–12, 1997, pp. 16, 17 & 18.

* cited by examiner

Primary Examiner—Allan R. Wilson
(74) Attorney, Agent, or Firm—Armstrong, Westerman & Hattori, LLP

(57) ABSTRACT

There is provided a semiconductor device having a COB type DRAM, which comprises a first insulating film formed on a semiconductor substrate, first wiring trenches formed in a first insulating film in the first region, second wiring trenches formed in the first insulating film in the second region to have a substantially same depth as the first wiring trenches, first wirings buried in lower portions of the first wiring trenches, a second insulating film buried in upper portions of the first wiring trenches and formed of material different from the first insulating film, and second wirings formed of same conductive material as the first wirings in the second wiring trenches and formed thicker than the first wirings. Accordingly, the pattern precision of the bit lines and the wirings that have a different film thickness can be increased, and through holes that are formed between the bit lines in the self-alignment manner are formed shallow, and also resistances of the bit lines and the wirings are reduced.

11 Claims, 32 Drawing Sheets

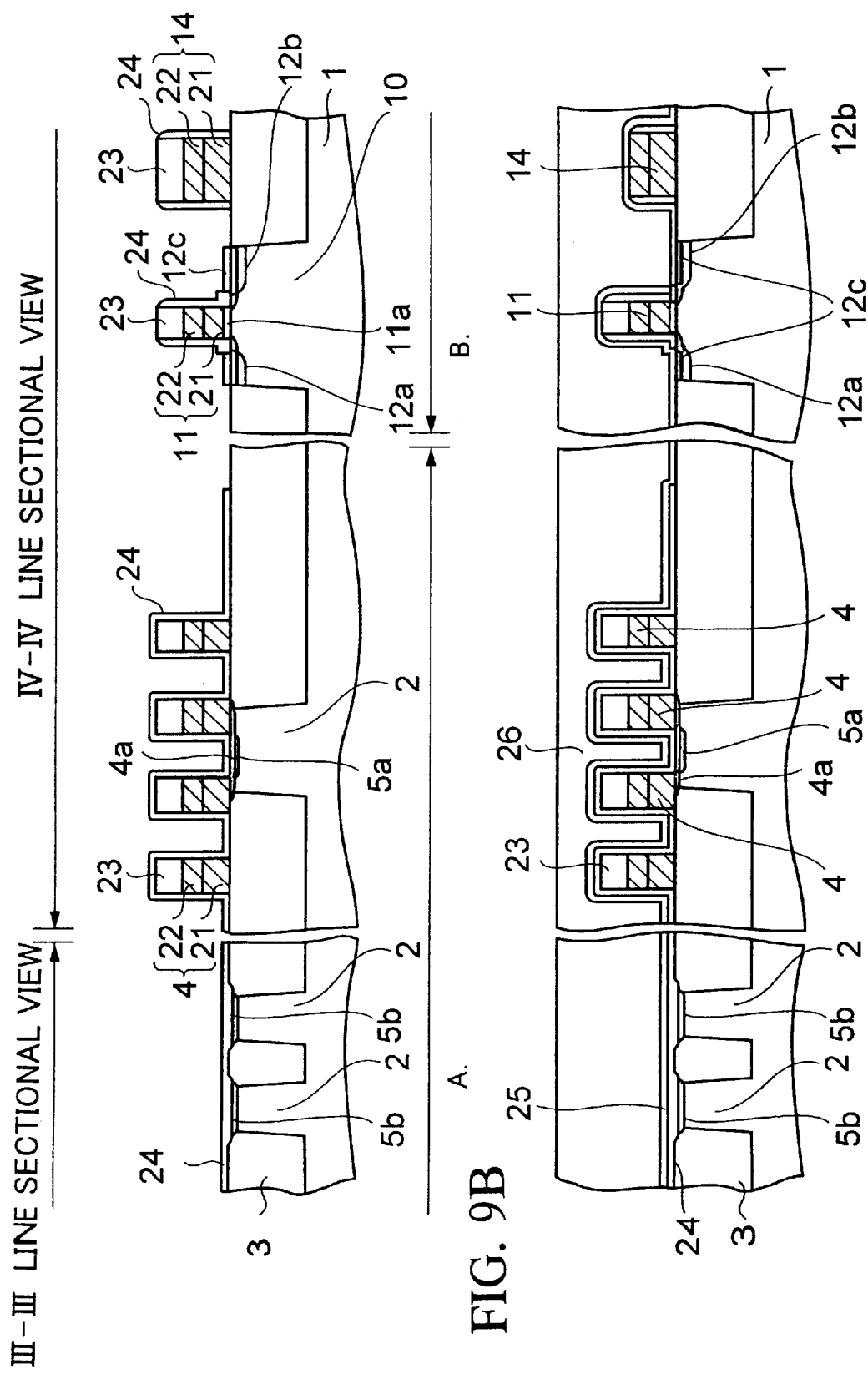

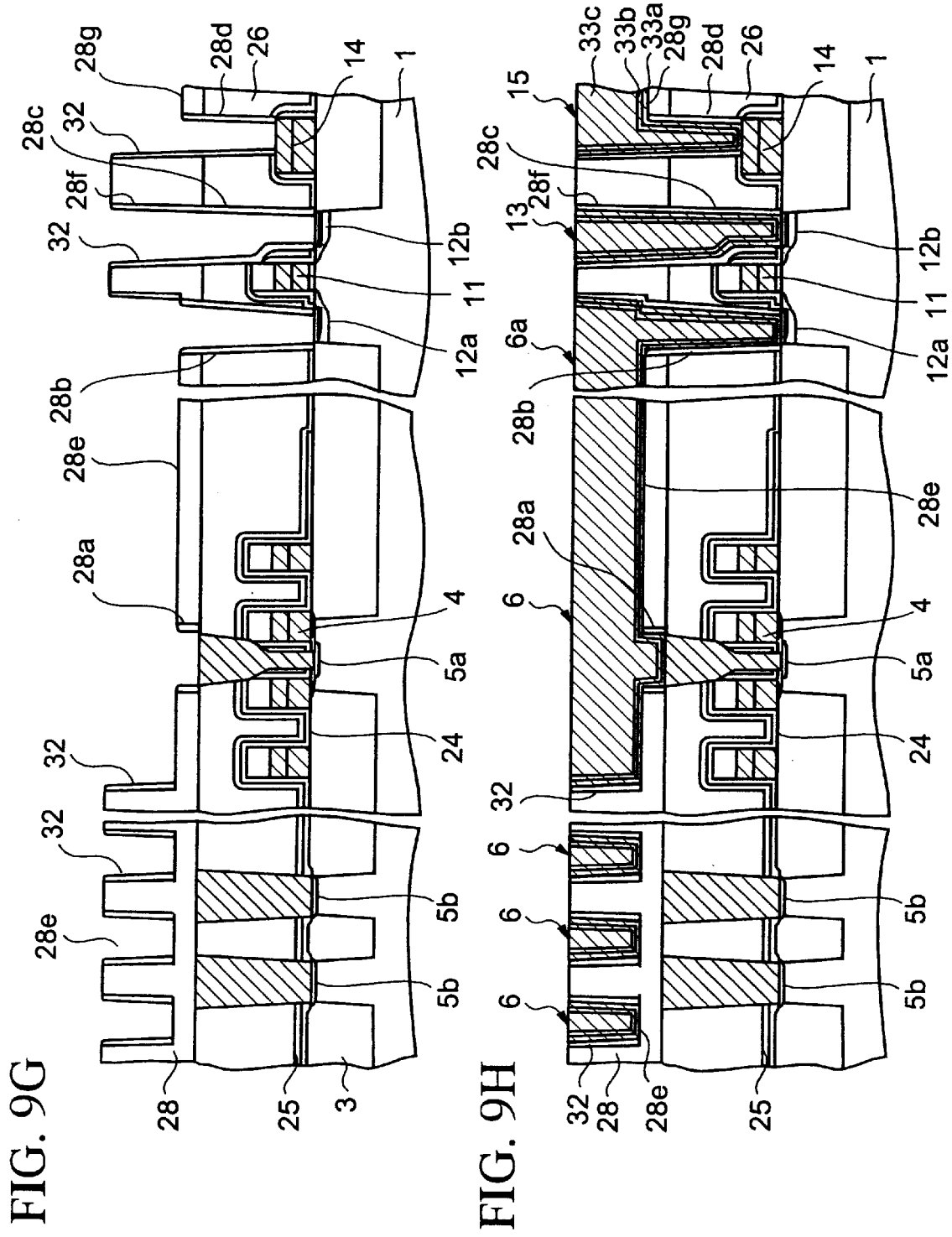

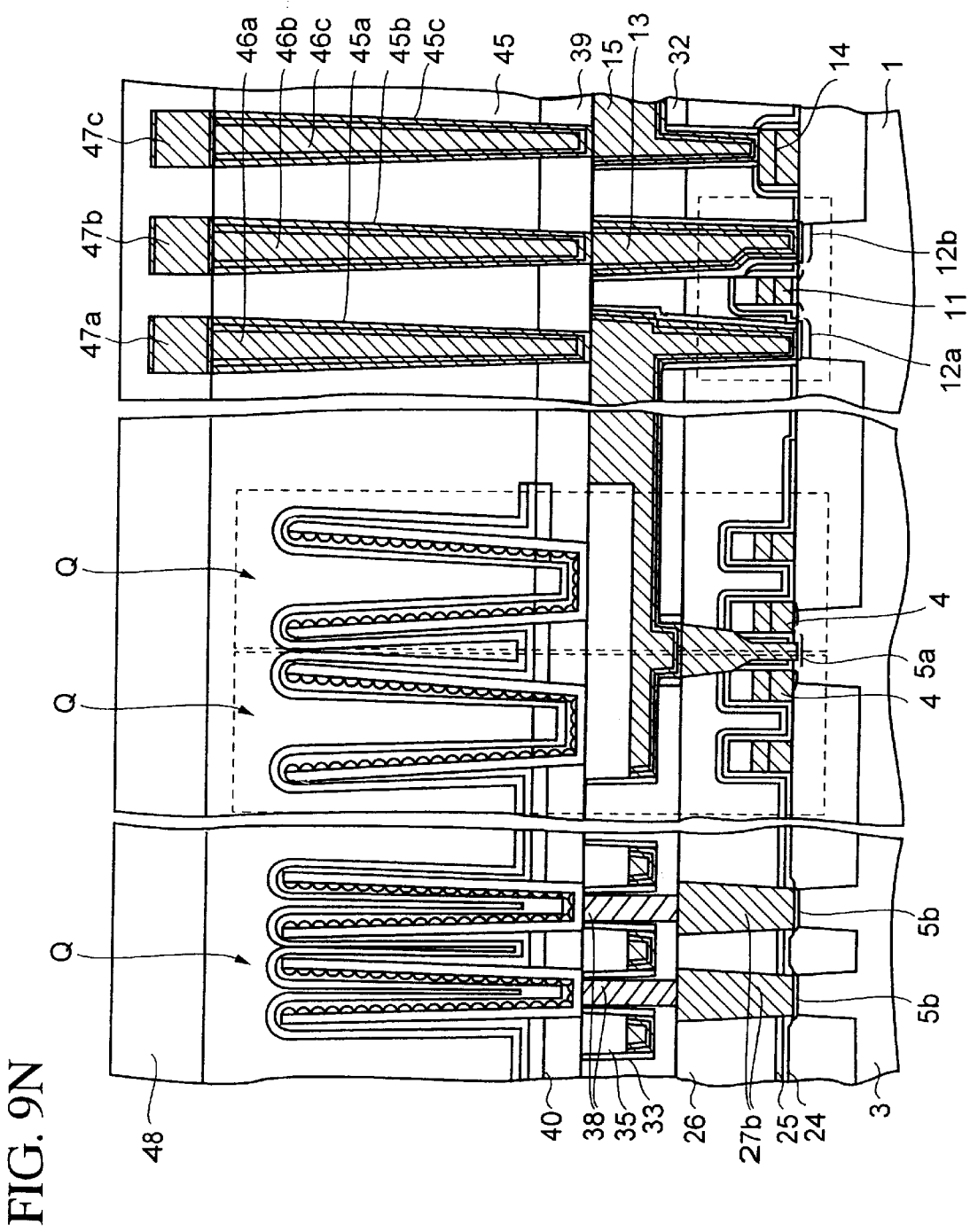

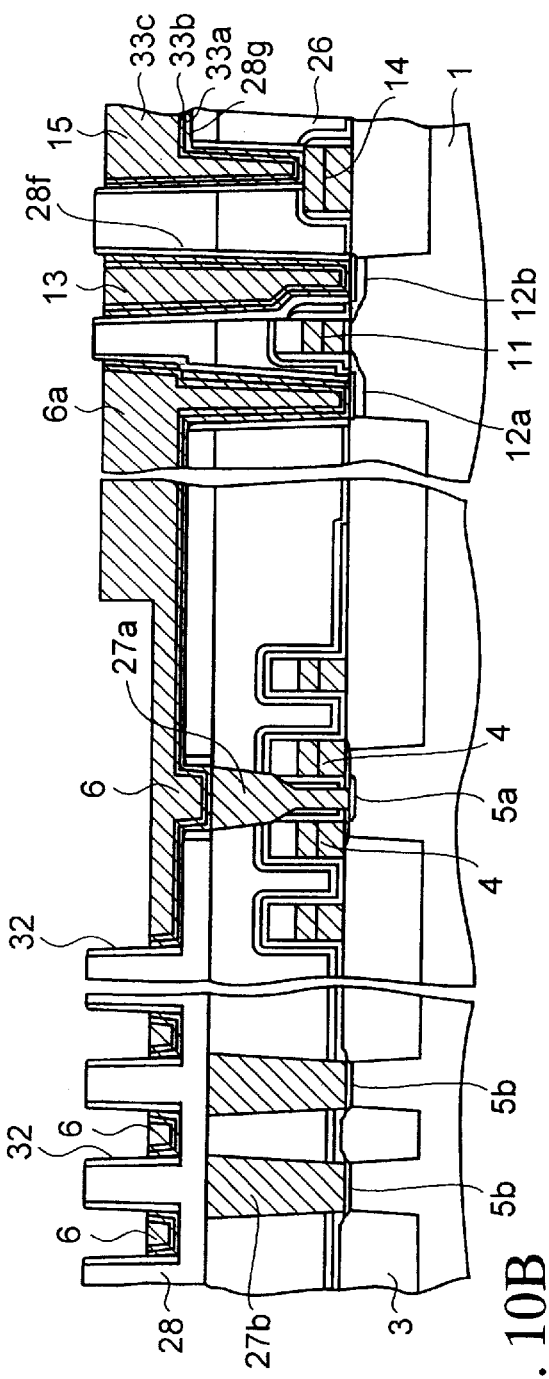
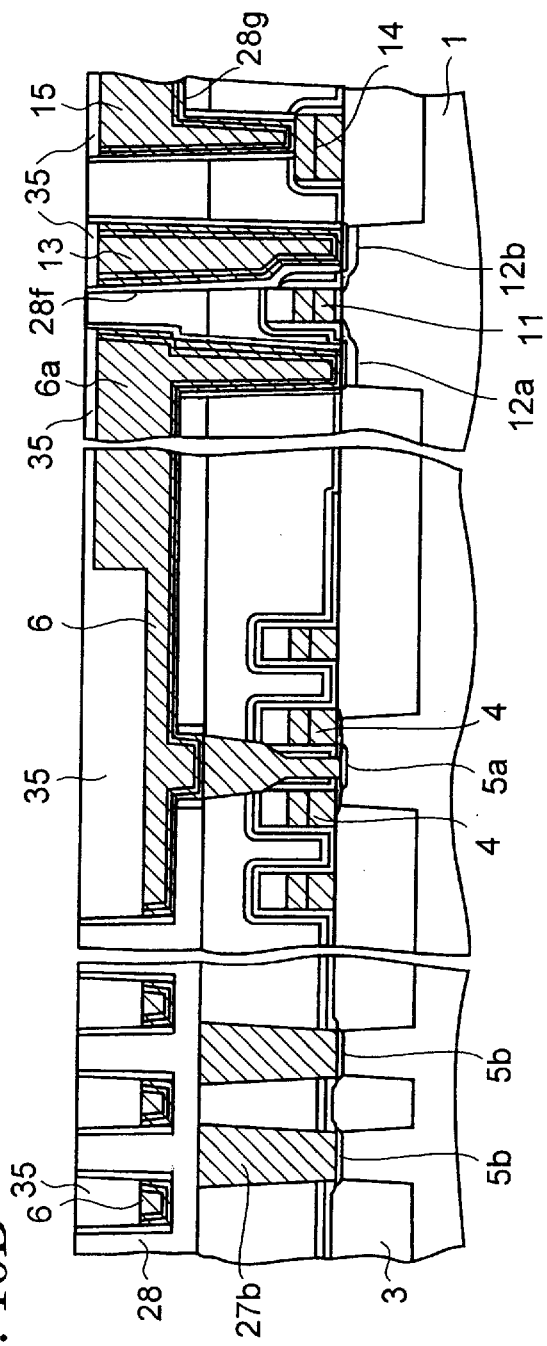

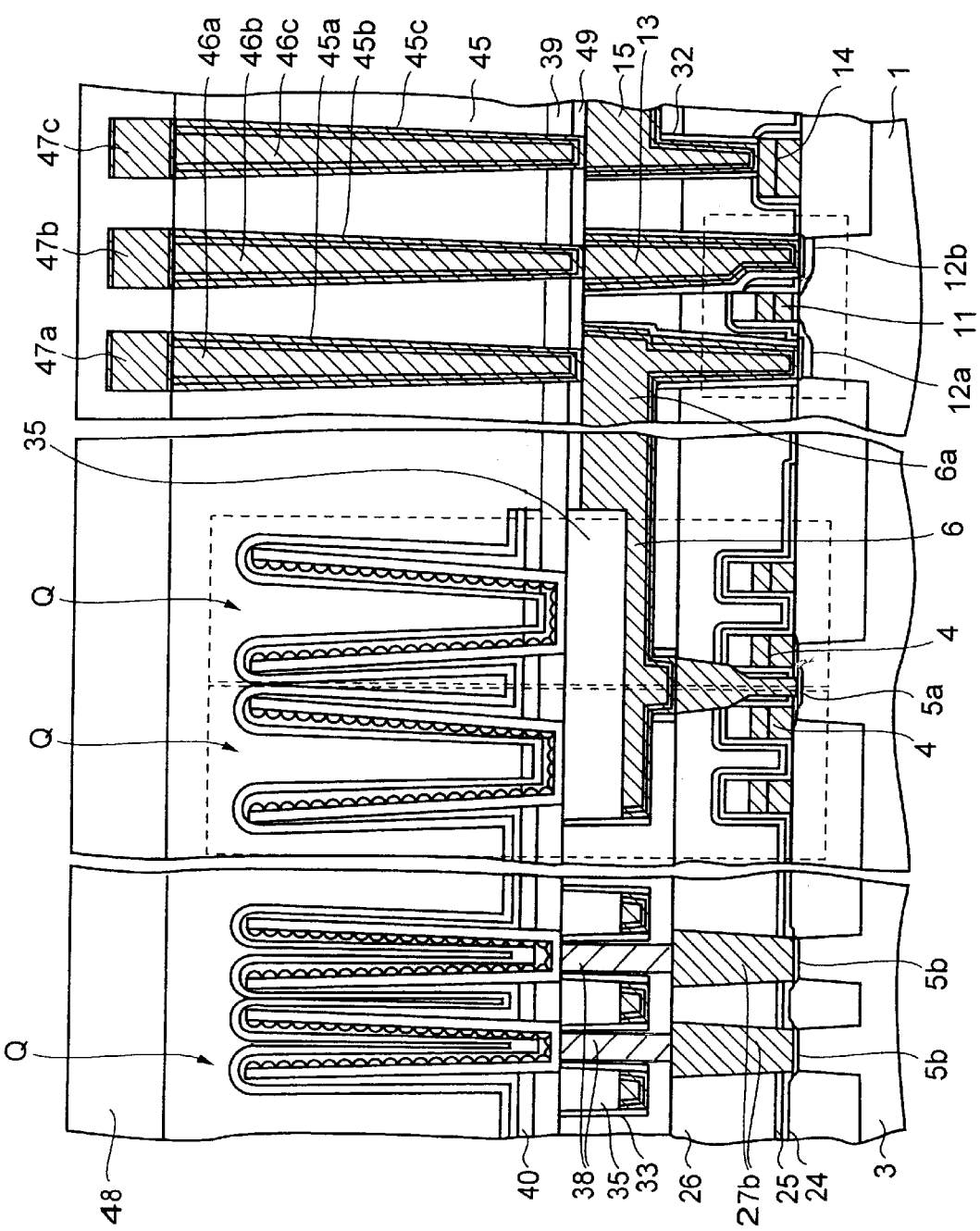

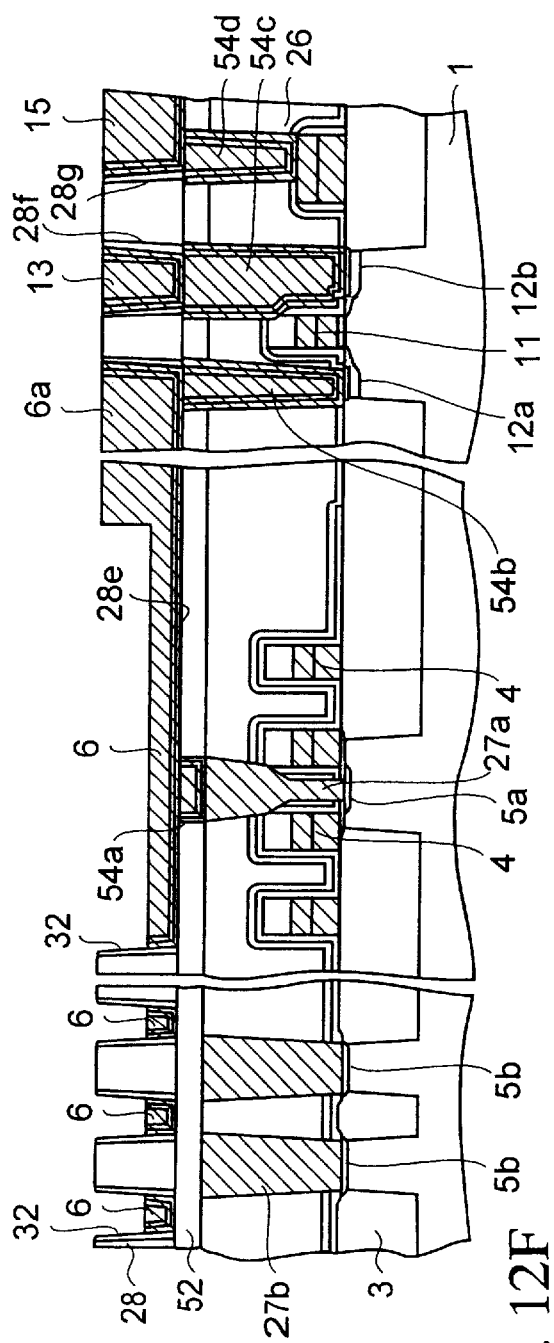
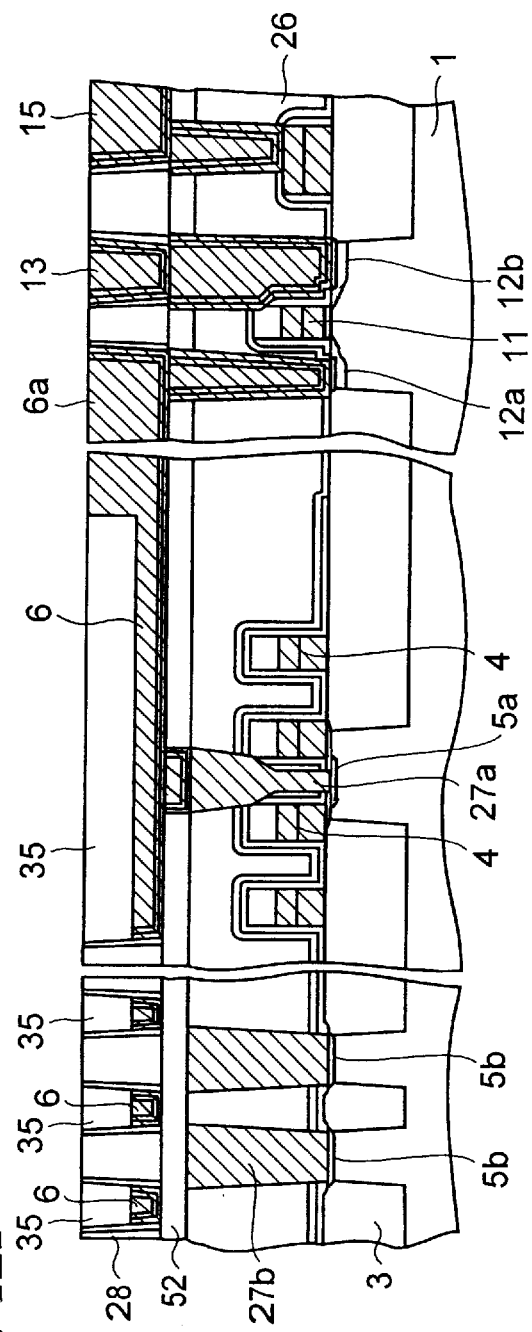
FIG. 12E
FIG. 12F

SEMICONDUCTOR DEVICE AND METHOD OF MANUFACTURING THE SAME

BACKGROUND OF THE INVENTION

1. Field of the Invention

The present invention relates to a semiconductor device and to a method of manufacturing the same and, more particularly, to a semiconductor device having a COB type DRAM and to a method of manufacturing the same

2. Description of the Prior Art

In recent DRAM, the COB (Capacitor Over Bit-line) type in which an information storage capacitor is arranged on a bit line connected to a transistor is used, and a logic circuit is often also formed on the same substrate on which the transistor and capacitor are formed. A wiring structure in a memory cell region and a peripheral circuit region of the COB type DRAM is shown in a plan view of FIG. 1, for example.

In FIG. 1, a memory cell region 101 and a peripheral circuit region 102 are arranged on a semiconductor substrate 100.

A plurality of active regions 103 are surrounded and partitioned by a device isolation insulating layer 104 in the memory cell region 101 of the semiconductor substrate 100. A plurality of word lines that are also used as gate electrodes formed on the active regions 103 via a gate insulating film (not shown). Also, impurity diffusion layers 103a, 103b serving as source/drain are formed on both sides of the word line 105 in the active regions 103. Accordingly, a plurality of MOS transistors are formed in the active regions 103.

A plurality of bit lines 106 are formed on the word lines 105 via a first interlayer insulating film (not shown), and the bit lines 106 and the word lines 105 are extended to intersect orthogonally with each other.

The bit line 106 is connected to the active region 103 via a contact hole 107 formed in the first interlayer insulating film. The impurity diffusion layer 103a put between two word lines 105 is located at a position to which the bit line 106 is connected. Also, storage electrodes (not shown) of a capacitor 108, that is formed on the bit line 106 via a second interlayer insulating film (not shown), are connected to the impurity diffusion layers 103b located near both ends of the active region 103. The storage electrodes are connected to the impurity diffusion layers 103b via storage contact holes 109 formed in the first and second interlayer insulating films.

An active region 110 is surrounded and partitioned by the device isolation insulating film 104 in the peripheral circuit region 102. A gate electrode 111 is formed on the active region 110 via a gate insulating film (not shown). Also, impurity diffusion layers 112a, 112b serving as source/drain are formed on both sides of the gate electrode 111 in the active region 110 of the semiconductor substrate 100. Accordingly, a MOS transistor is formed in the active region 110.

A first wiring 106a is formed integrally with the bit line 106 in the memory cell region 101 of the peripheral circuit region 102. The first wiring 106a is connected to one impurity diffusion layer 112a in the active region 110 via a contact hole 128b. Also, a second wiring 113 is connected to the other impurity diffusion layer 112b via a contact hole 128c.

In FIG. 1, a reference 114 denotes a lower wiring that has the almost same height as the gate electrode 111 in the peripheral circuit region 102. A third wiring 115 formed in the same layer as the second wiring 113 is connected onto the lower wiring 114.

Various structures of the bit lines 106, the wirings 106a, 113, 115 shown in FIG. 1 are known. Then, these structures will be explained hereunder.

FIG. 2 is sectional view showing a semiconductor device having the DRAM and the peripheral circuit. The same references as those in FIG. 1 denote the same elements. FIG. 2 shows a sectional shape taken along a I—I line in FIG. 1 and a sectional shape taken along a II—II line.

In FIG. 2, a plurality of active regions 103 are surrounded and partitioned by the device isolation insulating layer 104 in the memory cell region 101 of the semiconductor substrate 100. A plurality of MOS transistors are formed in these active regions 103.

Upper and side surfaces of a plurality of word lines (gate electrodes) 105, that are formed on the active regions 103 via the gate insulating film 105a, are covered with insulating films 121, 122. Also, impurity diffusion layers 103a, 103b serving as source/drain are formed on both sides of the word lines 105 in the active regions 103.

Also, the active region 110 is formed in the peripheral circuit region 102 to be surrounded by the device isolation insulating layer 104. A MOS transistor is formed in the active region 110. More particularly, the gate electrode 111 is formed in the active region 110 of the semiconductor substrate 100 via the gate insulating film 111a, and the impurity diffusion layers 112a, 112b serving as source/drain are formed on both sides of the gate electrode 111. Insulating films 121, 122 are formed on an upper surface and side surfaces of the gate electrode 111. In addition, a lower wiring 114 is formed on the device isolation insulating layer 104 in the peripheral circuit region 102.

A first interlayer insulating film 123 is formed on the semiconductor substrate 100 to cover the MOS transistor. Also, contact holes are formed in the first interlayer insulating film 123 on the impurity diffusion layers 103a, 103b in the memory cell region 101 respectively. First and second contact plugs 125a, 125b are formed in these contact holes. The first contact plug 125a is connected to the impurity diffusion layer 103a formed between the word lines 105, and the second contact plugs 125b are connected to the impurity diffusion layers 103b near both ends of the active regions 103.

A second interlayer insulating film 126 is formed on the first interlayer insulating film 123. A plurality of wiring trenches (recesses) 127a, 127b, 127c and a plurality of contact holes 128a, 128b, 128c, 128d are formed in the first interlayer insulating film 123 and the second interlayer insulating film 126 by the dual damascene method.

The wiring trenches 127a, 127b, 127c formed in the second interlayer insulating film 126 have a shape of the bit line 106 in the memory cell region 101 and shapes of the wirings 106a, 113, 115 in the peripheral circuit region 102 respectively.

The contact hole 128a located in the memory cell region 101 is formed to reach the first contact plug 125a from a bottom of the wiring trench 127a. The contact holes 128b, 128c, 128d are formed to reach the impurity diffusion layers 112a, 112b and the lower wiring 114 from bottoms of the wiring trenches 127a, 127b, 127c respectively.

A barrier metal layer and a tungsten layer are buried in sequence in a plurality of wiring trenches 127a, 127b, 127c and a plurality of contact holes 128a, 128b, 128c, 128d. The barrier metal layer and the tungsten layer formed on the second interlayer insulating film 126 are removed by the chemical mechanical polishing (CMP) method.

Accordingly, in the memory cell region 101, the bit line 106 made of a tungsten film is formed in the second interlayer insulating film 126 and also the bit line 106 is connected to the first contact plug 125a on the active region 103 via the contact hole 128a. Also, in the peripheral circuit region 102, the first, second and third wirings 106a, 113 and 115 made of the tungsten film are formed in the second interlayer insulating film 126. These wirings 106a, 113 and 115 are connected the impurity diffusion layers 112a, 112b and the lower wiring 114 via the contact holes 128b, 128c, 128d respectively.

A third interlayer insulating film 129 is formed on the bit line 106, the wirings 106a, 113, 115 and the second interlayer insulating film 126.

Storage contact holes 109 reaching upper surfaces of the second contact plugs 125b are formed in the first, second and third interlayer insulating film 123, 126, 129 in the memory cell region 101. Storage contact plugs 131 are formed in the storage contact holes 109. The storage contact holes 109 are formed to reach the second contact plugs 125b while passing through between a plurality of bit lines 106.

A silicon nitride film 132 is formed on the third interlayer insulating film 129. Openings whose size corresponds to the storage electrode of the capacitor are formed in the silicon nitride film 132 in the memory cell region 101. Cylindrical storage electrodes 133 are formed upwardly from the openings. Also, a dielectric film 134 is formed on surfaces of the storage electrodes 133. An opposing electrode (cell plate) 135 is formed on the dielectric film 134. Thus, the capacitor 108 consists of the storage electrodes 133, the dielectric film 134, and the opposing electrode 135. After such the capacitors 108 are formed, the dielectric film 134 and the opposing electrode 135 are removed from the peripheral circuit region 102 by the photolithography method.

Also, a fourth interlayer insulating film 136 is formed on the third interlayer insulating film 129 to cover the capacitors 108. A plurality of contact holes 137a, 137b, 137c reaching the first, second, and third wirings 106a, 113, 115 respectively are formed in the fourth interlayer insulating film 136 in the peripheral circuit region 102. Plugs 138a, 138b, 138c formed of a barrier metal film and a tungsten film are buried in these contact holes 137a, 137b, 137c respectively.

In addition, aluminum wirings 139a, 139b, 139c connected to the plugs 138a, 138b, 138c respectively are formed on the fourth interlayer insulating film 136.

The first, second, third, and fourth interlayer insulating film 123, 126, 129, 136 are formed of a silicon oxide or impurity containing silicon oxide.

In the mentioned-above semiconductor device, there is the possibility that, if pitches between the bit lines 106 are narrowed with the miniaturization of the memory cell, the storage contact plugs 131 come into contact with the bit lines 106 because of the slight displacement of the storage contact holes 109 that pass through between the bit lines 106. That is, the semiconductor device has a structure in which the storage contact plugs 131 cannot be formed in the self-align fashion with the bit lines 106.

In contrast, shown in FIG. 3, it is set forth in Symposium on VLSI Technology, pp.17–18, 1997 that a silicon nitride film 140 is formed on the bit lines 106 in the wiring trench 127a being formed by the damascene method. According to the structure shown in FIG. 3, upon forming the storage contact holes 109 in the first, second, and third interlayer insulating film 123, 126, 129 made of silicon oxide or impurity containing silicon oxide, the silicon nitride film 140 formed on the bit lines 106 can act as an etching preventing layer. Accordingly, since the contact between the storage contact hole 130 and the bit lines 106 can be prevented by the silicon nitride film 140, the storage contact holes 130 can be formed in the self-align fashion.

By the way, if the wirings 106a, 113, 115 are formed thick to reduce resistances of the wirings 106a, 113, 115 in the peripheral circuit region 102, the bit lines 106 that have the same structure as the wirings 106a, 113, 115 are also formed thick. Therefore, there is such a problem that capacitances between the bit lines 106 are increased. However, since the storage contact holes 130 are formed deeper as the bit lines 106 are formed thicker in FIG. 3, it is difficult to bury the storage contact plugs 131 into the storage contact holes 109. In other words, if an aspect ratio of the storage contact hole 109 is increased, there is the possibility that coverage of conductive material being filled into the storage contact holes 109 becomes worse. In contrast, such an approach may be thought of that forming positions of the bit lines 106 in the memory cell region 101 and the wirings 106a, 113, 115 in the peripheral circuit region 102 are lowered in height. But this approach is not practical since distances from the wirings 106a, 113, 115 to the word lines 105 and the lower wiring 114 must be assured to some extent.

In FIG. 3, the same references as those in FIG. 2 denote the same elements.

In order to overcome such problem, the structure in which the wirings in the peripheral circuit region are formed thicker than the bit lines is set forth in Patent Application Publication (KOKAI) Hei 10-200075 (U.S. Pat. No. 6,037, 207) and Patent Application Publication (KOKAI) Hei 10-223858.

FIG. 4 to FIG. 7 are sectional views showing the structures of the bit lines and the wirings set forth in Patent Application Publication (KOKAI) Hei 10-200075 respectively, and the same references as those in FIG. 2 denote the same elements.

In FIG. 4, the bit lines 141 are formed on the first interlayer insulating film 123 and are also connected to the impurity diffusion layers 103a in the memory cell region 101 via the first contact plugs 125a. Then, a first wiring 141a extended from the bit lines 141 to the peripheral circuit region 102 is connected to one impurity diffusion layer 112a in the active region 110 via the contact hole 128b. Also, in the peripheral circuit region 102, a second wiring 142 is formed on the first interlayer insulating film 123 and then the second wiring 142 is connected to the other impurity diffusion layer 112b in the active region 110 via the contact hole 128c.

The bit lines 141 and the first and second wirings 141a, 142 are formed by patterning the same metal film. That is, they are formed via steps of reducing the film thickness of the overall metal film in the memory cell region 101 and the metal film in a part of the peripheral circuit region 102 by etching these metal films using a first resist mask, and then etching simultaneously the metal films in the memory cell region 101 and the peripheral circuit region 102 using a second resist mask. Accordingly, the film thickness of the bit lines 141 in the memory cell region 101 and the first wiring 141a in the peripheral circuit region 102 is reduced smaller than that of the other wiring 142 in the peripheral circuit region 102.

The bit lines 141 in the memory cell region 101 and the first wiring 141a in the peripheral circuit region 102 shown in FIG. 5 is smaller in thickness than the second wiring 142 in the peripheral circuit region 102, like those shown in FIG. 4. However, an upper surface of the first interlayer insulating film 123 under the bit lines 141 and the first and second wirings 141a, 142 has different heights in the memory cell region 101 and the peripheral circuit region 102, and thus a level difference 123a exists between these regions 101 and 102. This level difference 123a is formed by the etching using a resist mask. The metal film formed on the first interlayer insulating film 123 is polished by the CMP method and then patterned into shapes of the bit lines 141 and the first and second wirings 141a, 142. Accordingly, the bit lines 141 and the first wiring 141a are smaller in height than the second wiring 142, but upper surfaces of the bit line 141 and the first and second wirings 141a, 142 are identical in height.

FIGS. 6A and 6B show steps of forming the bit lines 141 and the first and second wirings 141a, 142 on the first interlayer insulating film 123 that has the level difference 123a like FIG. 5. That is, as shown in FIG. 6A, contact holes are formed on the impurity diffusion layers 103a, 112a, 112b in the memory cell region 101 and the peripheral circuit region 102 respectively by patterning the first interlayer insulating film 123. Then, plugs 125a, 143a, 143b made of polysilicon are buried in the contact holes, and then the same level difference 123a as that in FIG. 5 is formed on the first interlayer insulating film 123 by using a resist mask. In this case, a part of the plug 143b in the peripheral circuit region 102 is also etched simultaneously. Then, a silicon nitride film 144 and a silicon oxide film 145 are formed in sequence on the first interlayer insulating film 123, and then the silicon oxide film 145 is planarized by the CMP method. After this, as shown in FIG. 6B, a first wiring trench 145a and a second wiring trench 145b are formed in the memory cell region 101 and the peripheral circuit region 102 respectively by patterning the silicon oxide film 145 and the silicon nitride film 144 in sequence. In this case, since the silicon nitride film 144 can act as the etching stopper film, depths of the first wiring trench 145a and the second wiring trench 145b become different. In addition, a metal film is filled into the first wiring trench 145a and the second wiring trench 145b, and thus the bit lines 141 and the first wiring 141a are formed in the first wiring trench 145a and also the second wiring 142 that is thicker than the bit lines 141 is formed in the second wiring trench 145b.

In FIGS. 6A and 6B, the same references as those in FIG. 2 denote the same elements.

In the meanwhile, the structure similar to those in FIGS. 6A and 6B is set forth in Patent Application Publication (KOKAI) Hei 10-223858. Since the silicon nitride film 144 is left in this structure, the step of forming contact holes by patterning the silicon nitride film 144 and the first interlayer insulating film 123 is employed after the first wiring trench 145a and the second wiring trench 145b are formed.

The bit lines 141 and first and second metal films 146, 147 shown in FIG. 7 are formed by the following method. That is, contact holes are formed on the impurity diffusion layers 103a, 112a, 112b in the memory cell region 101 and the peripheral circuit region 102 respectively by etching the first interlayer insulating film 123. Then, plugs 125a, 143a, 143b made of polysilicon are buried in the contact holes, and then a first metal film 146 is formed on a flat surface of the first interlayer insulating film 123. Then, a silicon oxide film 148 is formed on the first metal film 146 in the memory cell region 101 and also a second metal film 147 is formed on the first metal film 146 in the peripheral circuit region 102. Then, the bit line 141 and the wirings 141a, 142 are formed by patterning successively the first metal film 146, the second metal film 147 and the silicon oxide film 148. Accordingly, the thin bit lines 141 consisting of the first metal film 146 are formed in the memory cell region 101, and also the thick wirings 142 consisting of the first metal film 146 and the second metal film 147 are formed in the peripheral circuit region 102.

In FIG. 7, the same references as those in FIG. 2 denote the same elements.

By the way, according to the structure shown in FIG. 4, the metal film formed in the memory cell region 101 is thinned by selectively etching, and then the overall metal film is patterned simultaneously by the photolithography method. Therefore, since either the thin region or the thick region of the metal film is defocused when the photoresist used in patterning the overall metal film is exposed, such structure is undesirable for miniaturization. In addition, since both the thin region and the thick region of the metal film are etched in the same time upon patterning the overall metal film, side etching is caused in the thin region of the metal film and therefore conversion difference between the metal pattern (bit lines) in the memory cell region 101 and the metal pattern (wirings) in the peripheral circuit region 102 is easily caused.

Also, according to the structure shown in FIG. 5, difference in film thickness is provided to the metal films constituting the bit lines 141 and the first and second wirings 141a, 142, but their upper surfaces are made flat. Therefore, the problem of the defocusing of the resist formed on the metal film in exposure can be overcome. However, if the overall metal film having level difference on its lower side is patterned by the photolithography method, the thin region of the metal film is excessively etched to generate the side etching.

In addition, since respective upper surfaces of the bit lines 141 and the first and second wirings 141a, 142 are made flat, a position of the upper surfaces of the bit lines 141 becomes high if the second wiring 142 is formed thick. As a result, if the silicon nitride 140 shown in FIG. 3 is formed on the bit lines 141, the storage contact holes passing through between the bit lines 141 become deeper.

According to FIG. 4 and FIG. 5, it can be understood that, if the method of forming the bit lines and the wirings by patterning the metal film in which level difference is formed on the upper surface or the lower surface is employed, the improvement of the pattern precision of the bit lines cannot be achieved.

Further, according to the structure shown in FIG. 6A, in order to form the wiring trenches 145a, 145b having a different depth, the step of forming the silicon nitride film 144 as the etching stopper film and the step of etching the silicon nitride film 144 are needed, and thus throughput of the wiring formation is lowered.

In Patent Application Publication (KOKAI) Hei 10-223858 in which the structure similar to that shown in FIG. 6B is set forth, the silicon nitride film 144 serving as the etching stopper film is left. In this case, since the step of etching the silicon nitride film 144 and the first interlayer insulating film 123 by using two kinds of etchant is needed in the step of forming the contact holes used to connect the overlying bit lines 141 and the first and second wirings 141a, 142 to the impurity diffusion layers 103a, 112a, 112b, reduction in the throughput is inevitable.

Besides, according to the structure shown in FIG. 7, since the resist used upon patterning the first and second metal films 146, 147 and the silicon oxide film 148 is formed on the surfaces having the same height as the insulating film 148 and the second metal film 147, the problem of defocusing in the resist exposure is not caused. However, since different materials of the insulating film and the metal film are etched simultaneously after this, two kinds of etchant must be employed. In other words, since first the silicon oxide film 148 is etched and then the first and second metal films 146, 147 are patterned simultaneously, over-etching of the first metal film 146 serving as the bit lines is inevitable. In addition, the connection interface is present between the first metal film 146 and the second metal film 147 and thus the contact resistance is generated on the interface. Therefore, such structure is disadvantageous to reduction in the lower resistance of the wiring 142 in the peripheral circuit region 102.

SUMMARY OF THE INVENTION

It is an object of the present invention to provide a semiconductor device capable of increasing the pattern precision of the bit lines and the wirings which have a different film thickness, and reducing resistances of the bit lines and the wirings by forming shallow through holes that are formed between the bit lines in the self-alignment manner, and also improving lower resistance and throughput of the bit lines and the wirings, and a method of manufacturing the same.

According to the present invention, the depth of the first wiring trenches formed in the first region (memory cell region) of the first insulating film formed on the semiconductor substrate is set substantially equal to the depth of the second wiring trenches formed in the second region (peripheral circuit region), and the film thickness of the first wirings buried in the first wiring trenches is set thinner than that of the second wirings buried in the second wiring trenches, and the second insulating film is formed on the thinned first wirings.

Accordingly, there is no necessity to differentiate depths of a plurality of wiring trenches in the first region and the second region. Thus, the step of forming the etching stopper layer (silicon nitride film) to change the depths of the wiring trenches and the step of selectively etching the etching stopper layer can be omitted, and thus the reduction in throughput can be prevented.

Also, since the film thickness of the first wirings formed in the first wiring trenches and the film thickness of the second wirings formed in the second wiring trenches can be adjusted by thinning the first wirings, there is no need to form twice the same conductive film in the second wiring trenches by separate steps. Thus, the contact interface does not exist in the same conductive film, and the increase in resistance of the second wirings can be prevented.

Further, since the second insulating film (e.g. the silicon nitride film) covering the first wirings in the first region is buried only in the upper portions of the first wiring trenches, the upper surfaces of the second insulating film are substantially equal in height to the upper surfaces of the second wirings in the second region. Thus, the upper surfaces of the holes formed between a plurality of first wirings in the self-alignment manner can be set equal in height to the upper surfaces of the second wirings in the second region. Therefore, the holes can be formed shallow not to position higher than the second wirings, and thus the coverage of the conductive film buried in the holes as the plugs can be improved.

Moreover, after the pattern formation and the film thickness adjustment of the first wirings and the second wirings have been completed, the second insulating film formed on the first wirings can be formed. Therefore, it is not needed that the patterning of the second insulating film and the patterning of the first and second wirings should be carried out successively. Thus, tapering-off of the first wirings due to the over-etching is not caused. As a result, the pattern precision of the first wirings that are formed thinner than the second wirings can be improved.

BRIEF DESCRIPTION OF THE DRAWINGS

FIGS. 10A to 10F are sectional views showing steps of manufacturing a semiconductor device according to a second embodiment of the present invention;

FIGS. 11A to 11F are sectional views showing steps of manufacturing a semiconductor device according to a third embodiment of the present invention;

FIGS. 12A to 12I are sectional views showing steps of manufacturing a semiconductor device according to a fourth embodiment of the present invention;

DESCRIPTION OF THE PREFERRED EMBODIMENTS

Embodiments of the present invention will be explained with reference to the accompanying drawings hereinafter.

First Embodiment

Figure 1:
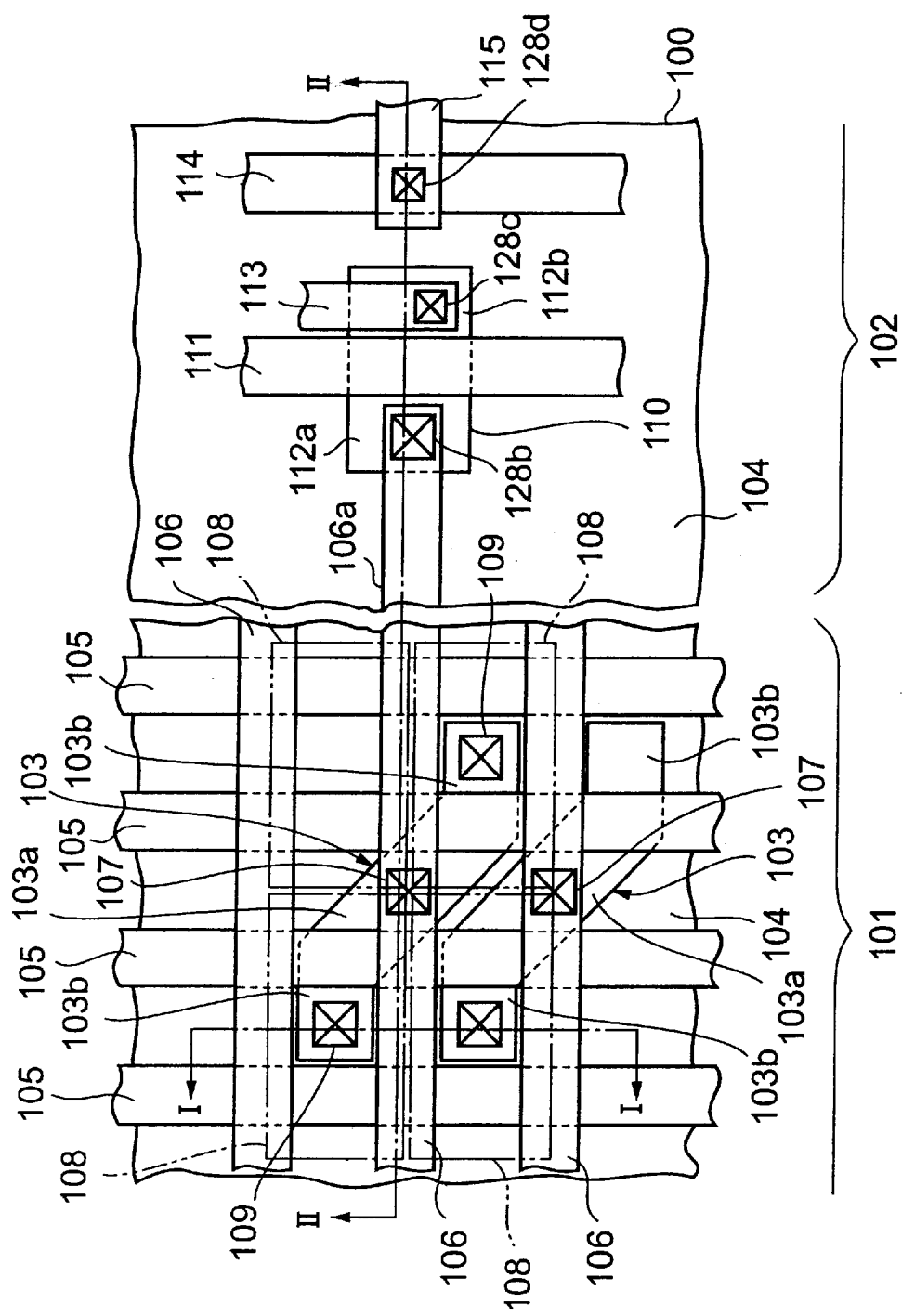
FIG. 1 is a plan view showing an example of a semiconductor device in the prior art.
Figure 2:
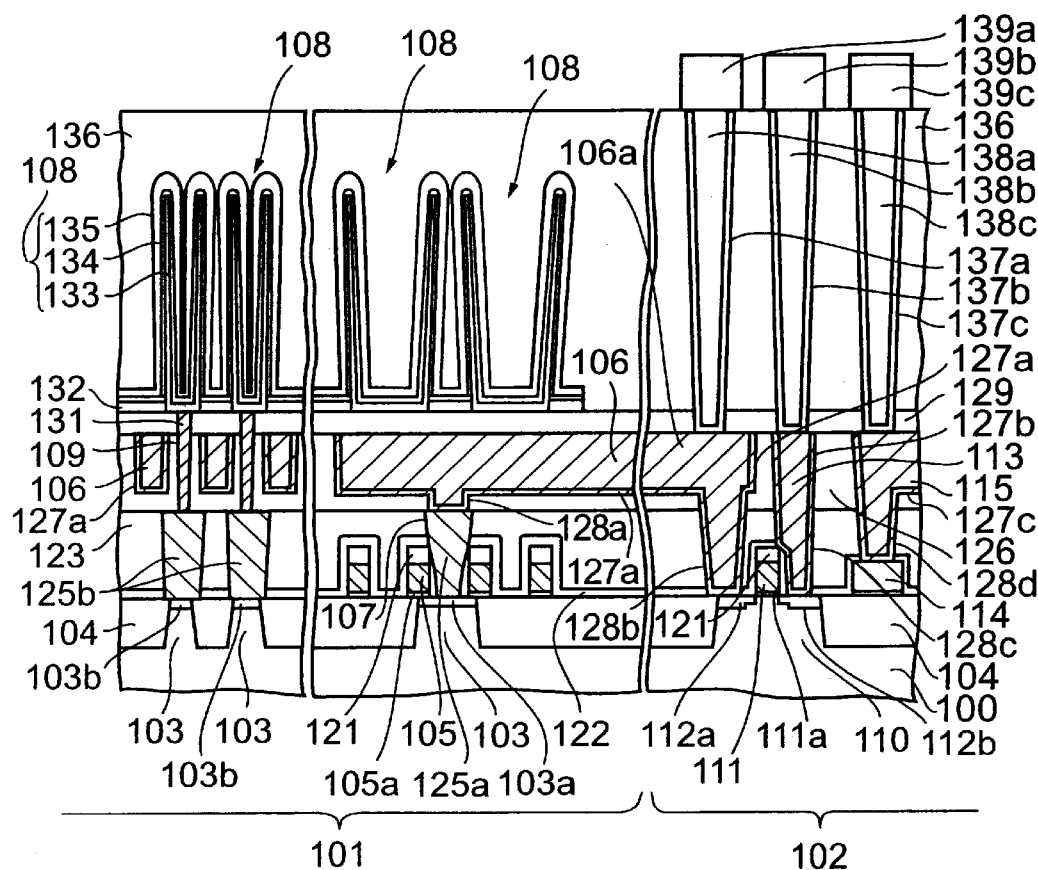
FIG. 2 is sectional view showing a first semiconductor device in the prior art.
Figure 3:
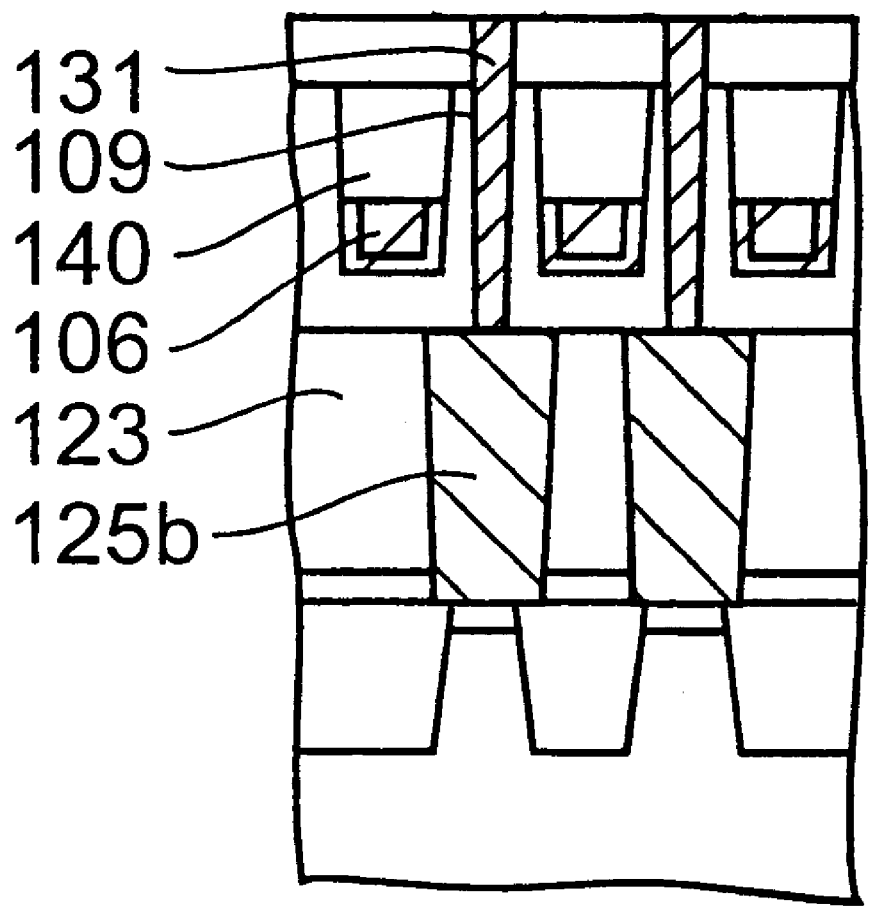
FIG. 3 is sectional view showing a second semiconductor device in the prior art.
Figure 4:
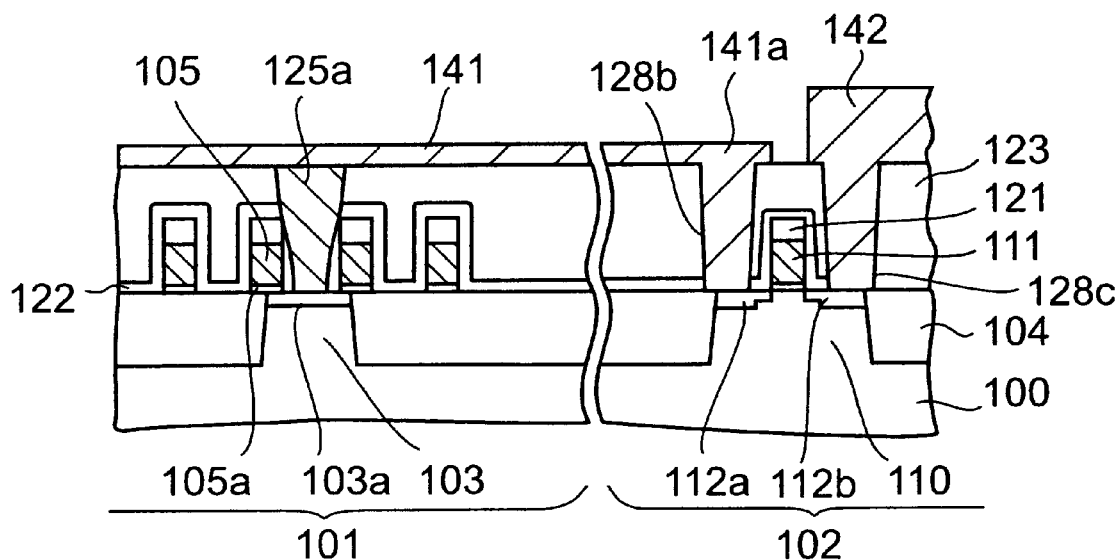
FIG. 4 is sectional view showing a third semiconductor device in the prior art.
Figure 5:
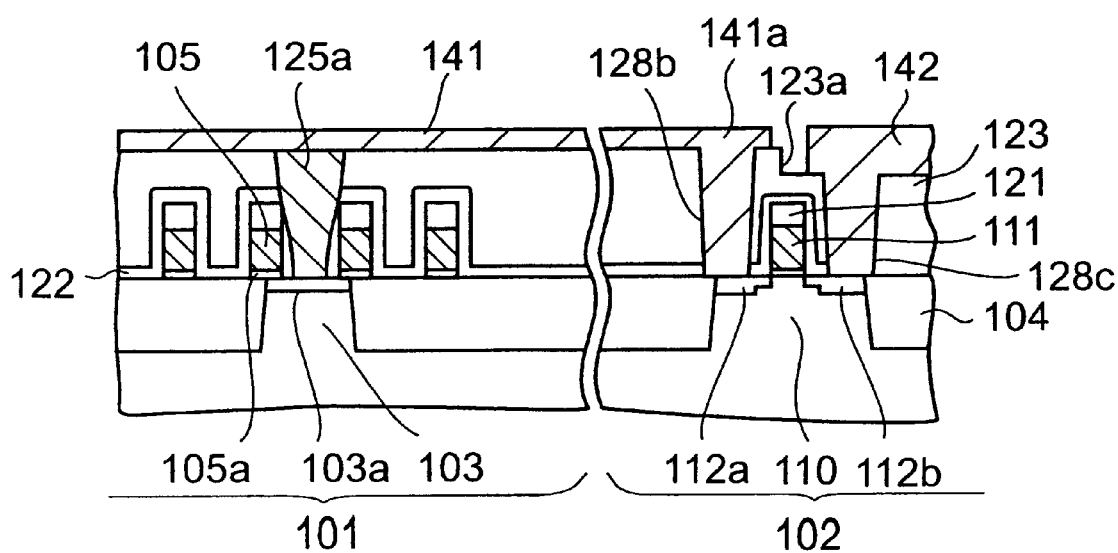
FIG. 5 is sectional view showing a fourth semiconductor device in the prior art.
Figure 6A:
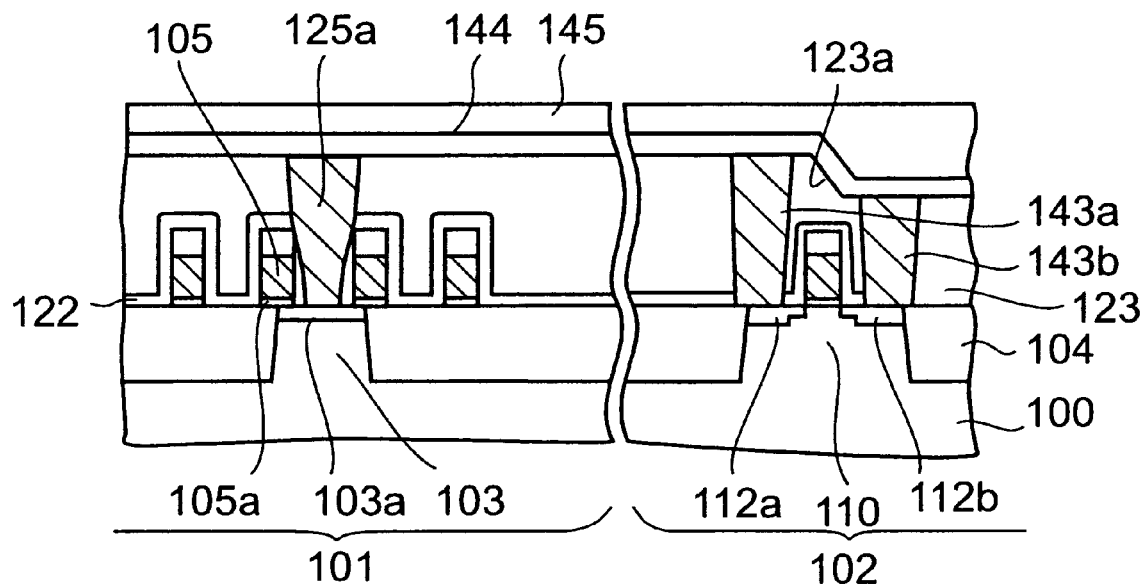
FIGS. 6A and 6B are sectional views showing steps of forming wirings of a fifth semiconductor device in the prior art.
Figure 6B:
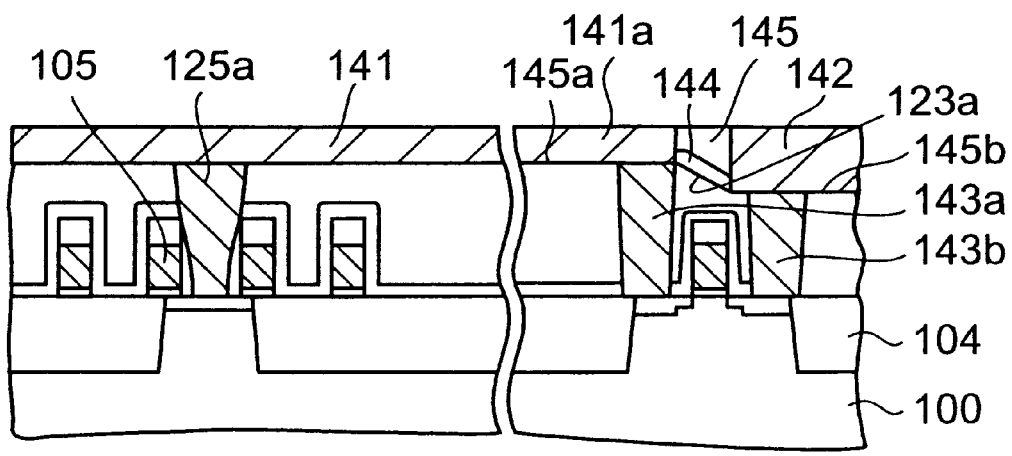
Figure 7:
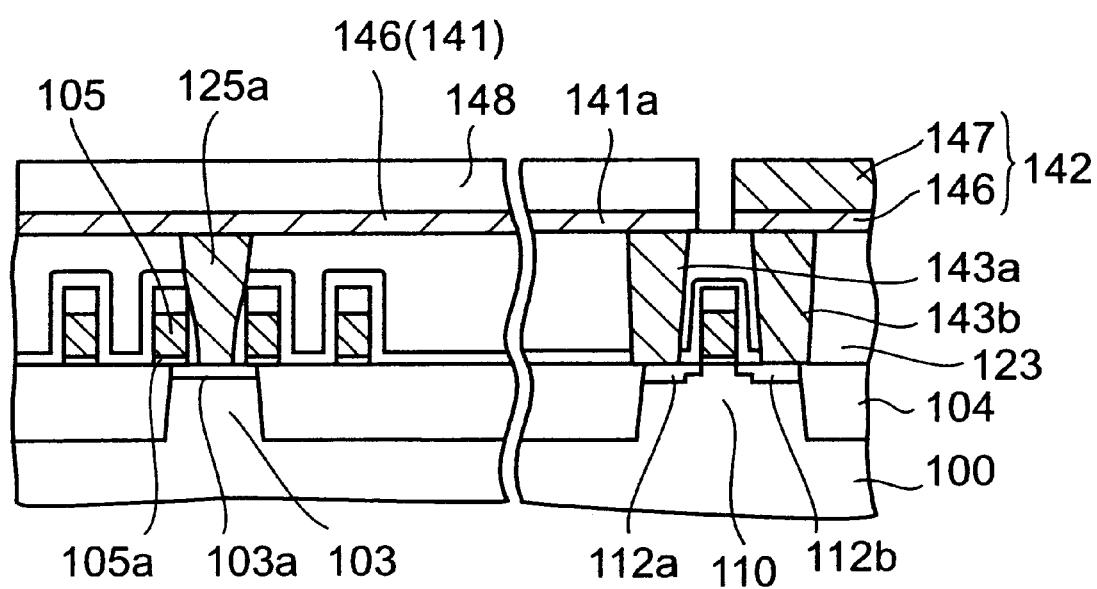
FIG. 7 is sectional view showing a sixth semiconductor device in the prior art.
Figure 8:
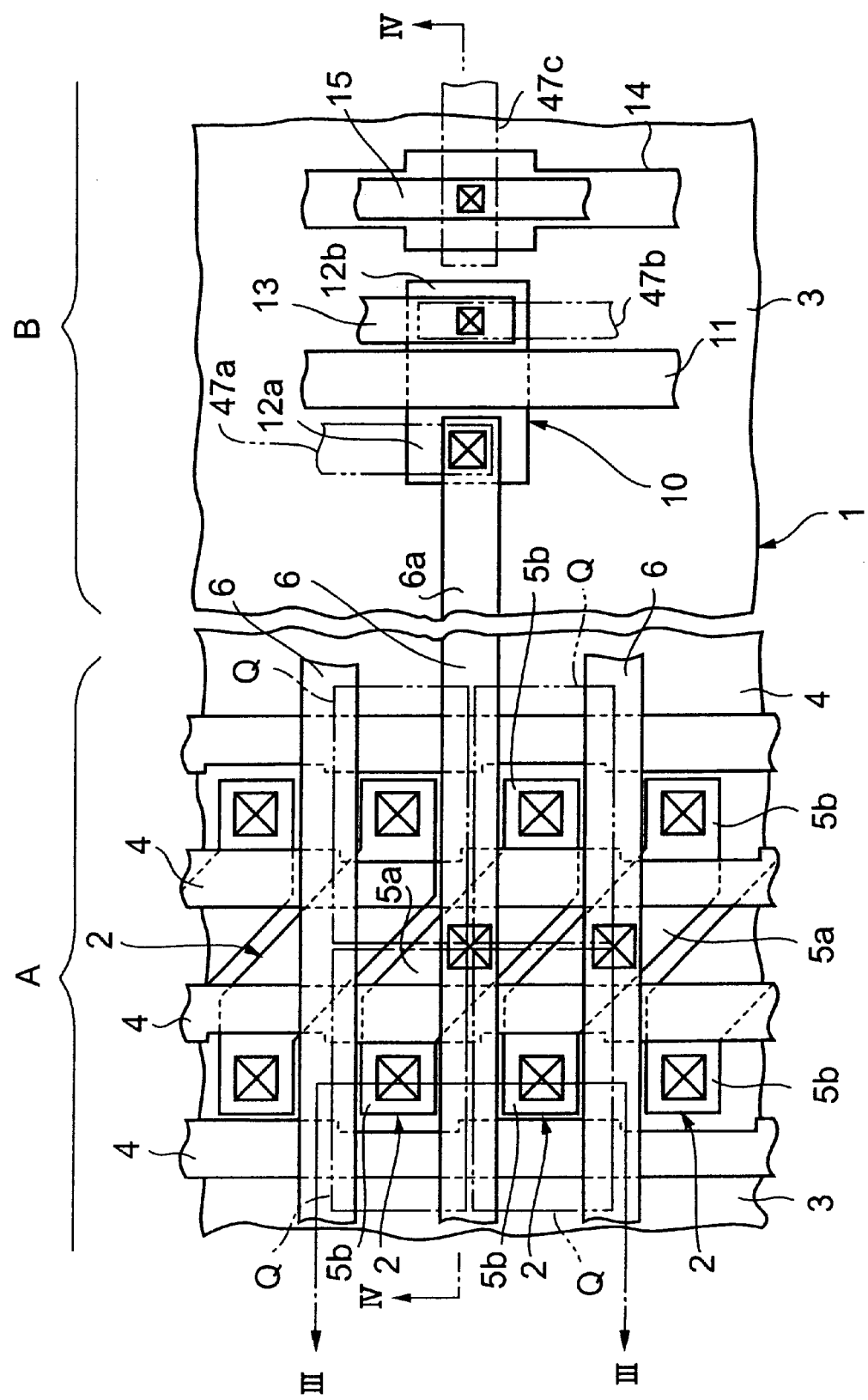
FIG. 8 is a plan view showing a semiconductor device according to embodiments of the present invention.

FIG. 8 is a plan view showing a memory cell region and a peripheral circuit region of a semiconductor device according to embodiments of the present invention, wherein an interlayer insulating film is omitted.

In FIG. 8, a plurality of active regions 2 are surrounded and partitioned by a device isolation insulating film 3 in the memory cell region A of a silicon (semiconductor) substrate 1.

A plurality of word lines 4 being also used as the gate electrodes are formed on the device isolation insulating film 3 and the active regions 2. A gate insulating film, described later, is formed on a surface of the semiconductor substrate 1 under the word lines 4 in the active regions 2. Also, impurity diffusion layers 5a, 5b serving as source/drain are formed on both sides of the word lines 4 in the active regions 2.

Accordingly, a plurality of MOS transistors each consisting of the word line 4, the impurity diffusion layers 5a, 5b, etc. are formed in the active regions 2.

A plurality of bit lines 6 are formed on the word lines 4 via the interlayer insulating film, and the bit lines 6 and the word lines 4 are extended to intersect orthogonally with each other.

The bit lines 6 are electrically connected to the impurity diffusion layers 5a formed in the middle of the active regions 2 via contact holes described later. Also, the storage electrodes of the capacitors Q, that are formed over the bit lines 6 via the interlayer insulating film, are electrically connected to the impurity diffusion layers 5b, that are formed on both ends of the active regions 2, via contact holes described later.

An active region 10 is surrounded and partitioned by the device isolation insulating film 3 in the peripheral circuit region B of the silicon substrate 1. A gate electrode 11 is formed on the active region 10 via a gate insulating film described later. Also, impurity diffusion layers 12a, 12b serving as source/drain are formed on both sides of the gate electrode 11 in the active region 10 of the silicon substrate 1. Accordingly, a MOS transistor consisting of the gate electrode 11, the impurity diffusion layers 12a, 12b, etc. is formed in the active region 10.

Also, a first wiring 6a constructed by extending the conductive pattern of the above bit line 6, as it is, is formed in the peripheral circuit region B. The first wiring 6a is electrically connected to one impurity diffusion layer 12a in the active region 10 via a contact hole described later. A second wiring 13 is electrically connected to the other impurity diffusion layer 12b via a contact hole described later.

In addition, a lower wiring 14 made of the same material as the gate electrode 11 is formed on the device isolation insulating film 3 in the peripheral circuit region B. A third wiring 15 formed over this lower wiring 14 is connected to the lower wiring 14.

In FIG. 8, references 47a to 47c denote second layer wirings formed over the wirings 6a, 13, 15 in the peripheral circuit region B.

Next, steps of manufacturing a semiconductor device according to a first embodiment of the present invention will be explained with reference to FIGS. 9A~9N hereinafter. These sectional views show sectional shapes viewed from a III—III line and a IV—IV line in FIG. 8 respectively.

First, steps required to get a configuration shown in FIG. 9A will be explained hereunder.

A shallow trench isolation (STI) having a depth of 300 nm is formed around respective active regions 2, 10 in the memory cell region A and the peripheral circuit region B of the p-type silicon substrate 1 as the device isolation insulating film 3. In this case, an insulating layer formed by the LOCOS (LOCal Oxidation of Silicon) method, and others may be employed in place of STI.

After such device isolation insulating films 3 are formed, gate insulating films 4a, 11a made of silicon oxide are formed in respective active regions 2, 10 by thermally oxidizing a surface of the silicon substrate 1 in respective active regions 2, 10 in the memory cell region A and the peripheral circuit region B.

In addition, a polysilicon film 21, a tungsten silicide film 22, and a protection insulating film 23 are formed in sequence on an entire surface of the silicon substrate 1. The protection insulating film 23 is used to form SAC (Self-Align Contact) in later steps, and is formed of a silicon nitride film of 150 nm, for example.

Then, the protection insulating film 23, the tungsten silicide film 22, and the polysilicon film 21 are patterned by the photolithography method using resist. Thus, a plurality of word line 4 that consist of the polysilicon film 21, the tungsten silicide film 22, and the protection insulating film 23 and also act as the gate electrodes are formed in the memory cell region A, and also a plurality of gate electrodes 11 and lower wirings 14 consisting of the polysilicon film 21 and the tungsten silicide film 22 are formed in the peripheral circuit region B. The protection insulating film 23 having the same shape is left on the word lines 4 and the gate electrodes 11, but such film 23 is removed from at least wiring connection portions of the lower wirings 14.

The conductive film constituting the word lines 4 and the gate electrodes 11 is not limited to the above polycide structure, only the polysilicon film or a polymetal may be employed.

Further, n-type impurity diffusion layers 5a, 5b, 12a, 12b are formed in the active regions 2, 10 respectively by ion-implanting an n-type impurity into both sides of the word lines 4 and the gate electrodes 11 in the self-alignment fashion in respective active regions 2, 10 of the memory cell region A and the peripheral circuit region B. Accordingly, MOS transistors each consisting of the word line (gate electrode) 4, the impurity diffusion layers 5a, 5b, etc. are formed in the memory cell region A.

Then, a silicon nitride film 24 of 20 to 100 nm thickness, e.g., 50 nm thickness, is formed on the silicon substrate 1 to cover the word lines 4, the gate electrodes 11, and the lower wirings 14.

Then, the silicon nitride film 24 in the peripheral circuit region B is etched in the vertical direction by the anisotropic etching in the situation that the silicon nitride film 24 in the memory cell region A is covered with the resist (not shown). Thus, the silicon nitride film 24 in the peripheral circuit region B is left as sidewalls on side surfaces of the gate electrodes 11 and the lower wirings 14, but such film 24 is removed from upper surfaces of the impurity diffusion layers 12a, 12b on both sides of the gate electrodes 11. The silicon nitride film 24 is left as it is in the memory cell region A.

After the resist is removed, the impurity diffusion layers 12a, 12b in the active region 10 are formed into an LDD structure respectively by ion-implanting the n-type impurity again into the active region 10 on both sides of the gate electrodes 11 in the peripheral circuit region B while using the silicon nitride film 24 and the gate electrodes 11 as a mask. Accordingly, the MOS transistors each consisting of the impurity diffusion layers 12a, 12b having the LDD structure, the gate electrode 11, etc. are formed in the peripheral circuit region B.

In turn, a cobalt film is formed on the overall surface of the silicon substrate 1, and then a cobalt silicide layer 12c is formed on the surfaces of the impurity diffusion layers 12a, 12b in the peripheral circuit region B by heating the silicon substrate 1. The unreacted cobalt film is removed by the wet etching.

Next, steps required to get a configuration shown in FIG. 9B will be explained hereunder.

First, a second silicon nitride film 25 of 2 to 100 nm thickness, e.g., 25 nm thickness, is formed on the silicon substrate 1 to cover the silicon nitride film 24, the impurity diffusion layers 12a, 12b, etc. Then, a BPSG film of about 800 nm thickness is formed as a first interlayer insulating film 26 on the second silicon nitride film 25 by the CVD method. Then, a surface of the first interlayer insulating film 26 is planarized by the CMP method. In this case, a silicon oxide may be formed as the first interlayer insulating film 26, and the heat reflow method may be employed as the planarization of the first interlayer insulating film 26.

Next, steps required to get a configuration shown in FIG. 9C will be explained hereunder.

First, a resist pattern (not shown) having openings on the impurity diffusion layers 5a, 5b in the active regions 2 in the memory cell region A is formed on the first interlayer insulating film 26. Then, first and second contact holes 26a, 26b reaching the impurity diffusion layers 5a, 5b are formed by etching the first interlayer insulating film 26 and the first and second silicon nitride films 24, 25 by virtue of the anisotropic etching using the resist pattern as a mask.

If a mixed gas containing $C_4F_8$ and $CH_2F_2$, for example, is employed as the etching gas for the first interlayer insulating film 26, the first and second silicon nitride films 24, 25 function as an etching stopper layer. In addition, a gas containing $CF_3$ is employed as the etching gas for the first and second silicon nitride films 24, 25. In this case, if the etching conditions are set to leave at least the first silicon nitride film 24 on side portions of the word lines 4, the first and second contact holes 26a, 26b are formed between the word lines 4 in the self-alignment manner.

The first contact hole 26a on the impurity diffusion layer 5a formed in the middle of the active region 2 is used as the bit line contact, and the second contact hole 26b on the impurity diffusion layer 5b formed near both ends of the active region 2 is used as the storage contact.

Then, contact resistances of landing pads, formed subsequently, and the impurity diffusion layers 5a, 5b are lowered by ion-implanting the n-type impurity into the impurity diffusion layers 5a, 5b via the contact holes 26a, 26b.

Then, the resist pattern is removed, and then an amorphous silicon film into which the impurity is doped is formed on the first interlayer insulating film 26 and in the contact holes 26a, 26b in the memory cell region A by the CVD method. Then, the amorphous silicon film is removed from the surface of the first interlayer insulating film 26 by the CMP method.

Accordingly, the amorphous silicon film buried in the first contact hole 26a is used as a bit-line landing pad 27a, and the amorphous silicon film buried in the second contact hole 26b is used as a storage-contact landing pad 27b.

Figure 9C:
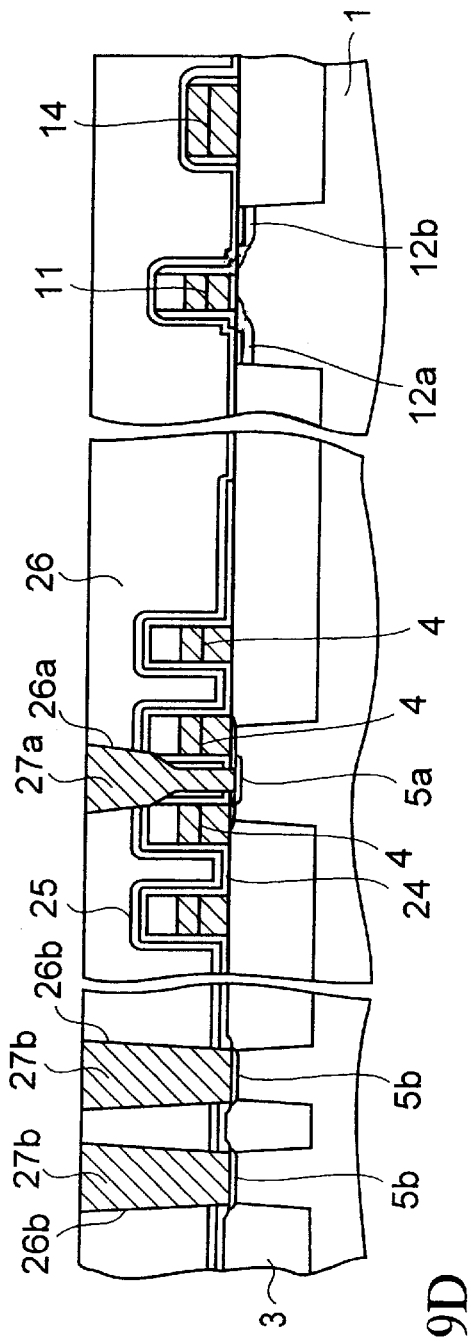
FIGS. 9A to 9N are sectional views showing steps of manufacturing a semiconductor device according to a first embodiment of the present invention.
Figure 9D:
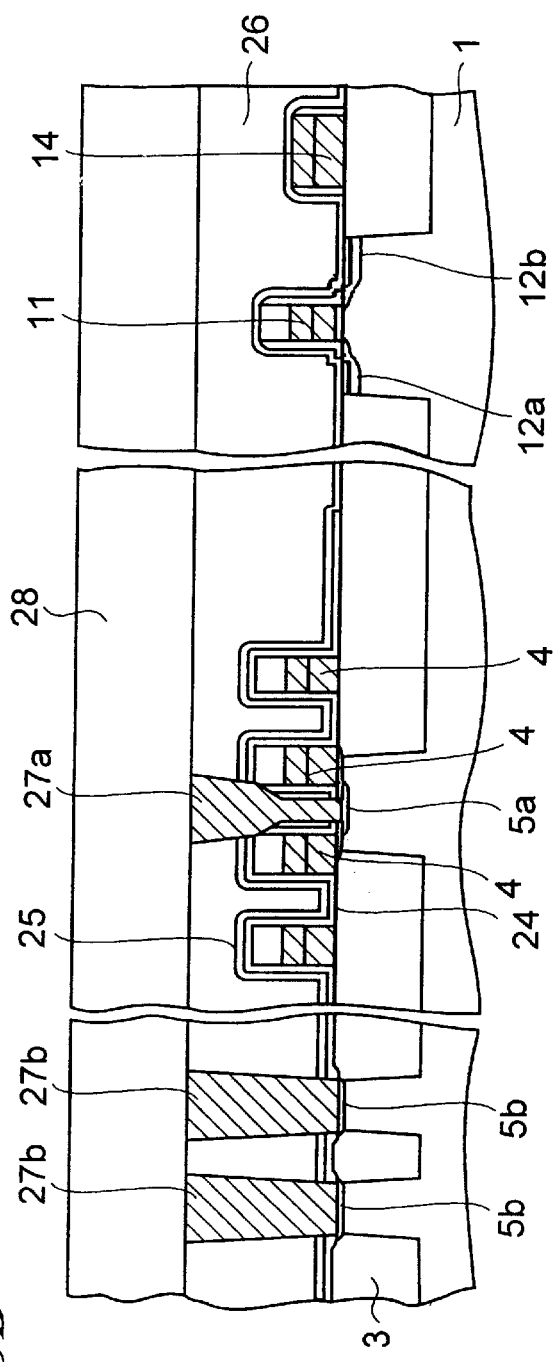

Then, as shown in FIG. 9D, a silicon oxide film for covering the landing pads 27a, 27b on the first interlayer insulating film 26 is formed as a second interlayer insulating film 28 to have a thickness of about 400 nm.

Next, steps of forming the bit lines and the wirings in the first and second interlayer insulating films 26, 28 by the dual damascene method will be explained hereunder.

Figure 9E:
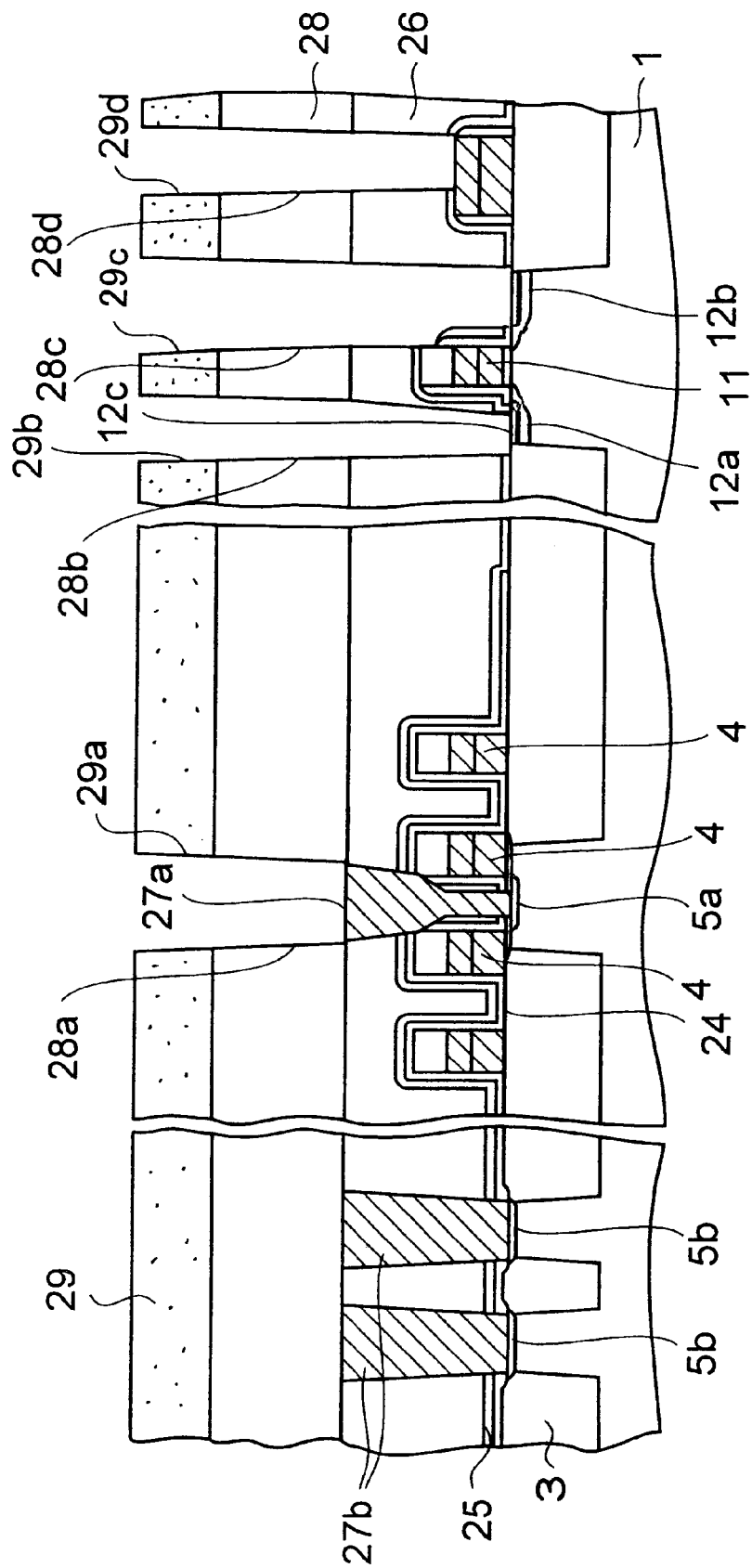

Then, as shown in FIG. 9E, openings 29a, 29b, 29c, 29d are formed by coating a resist 29 on the second interlayer insulating film 28 and then exposing/developing it. These openings 29a, 29b, 29c, 29d are formed over the bit-line landing pad 27a in the memory cell region A and over the impurity diffusion layers 12a, 12b and the lower wiring 14 in the peripheral circuit region B respectively.

Then, the first and second interlayer insulating films 26, 28 are etched by the reactive ion etching (RIE) method using the mixed gas containing $C_4F_8$ and $CH_2F_2$ while using the resist 29 as a mask. Thus, first to fourth contact holes 28a to 28d are formed to reach the bit-line landing pad 27a in the memory cell region A and the impurity diffusion layers 12a, 12b and the lower wiring 14 in the peripheral circuit region B respectively. In this case, since the second silicon nitride film 25 functions as the etching stopper layer, the device isolation insulating layer 3 is prevented from being etched even when depths of the first to fourth contact holes 28a to 28d are different. The second silicon nitride film 25 under the first to fourth contact holes 28a to 28d is selectively etched by using a different reaction gas.

Then, the resist 29 is removed, and then organic material 30 is filled into the contact holes 28b to 28d formed in the first interlayer insulating film 26 in the peripheral circuit region B.

Figure 9F:
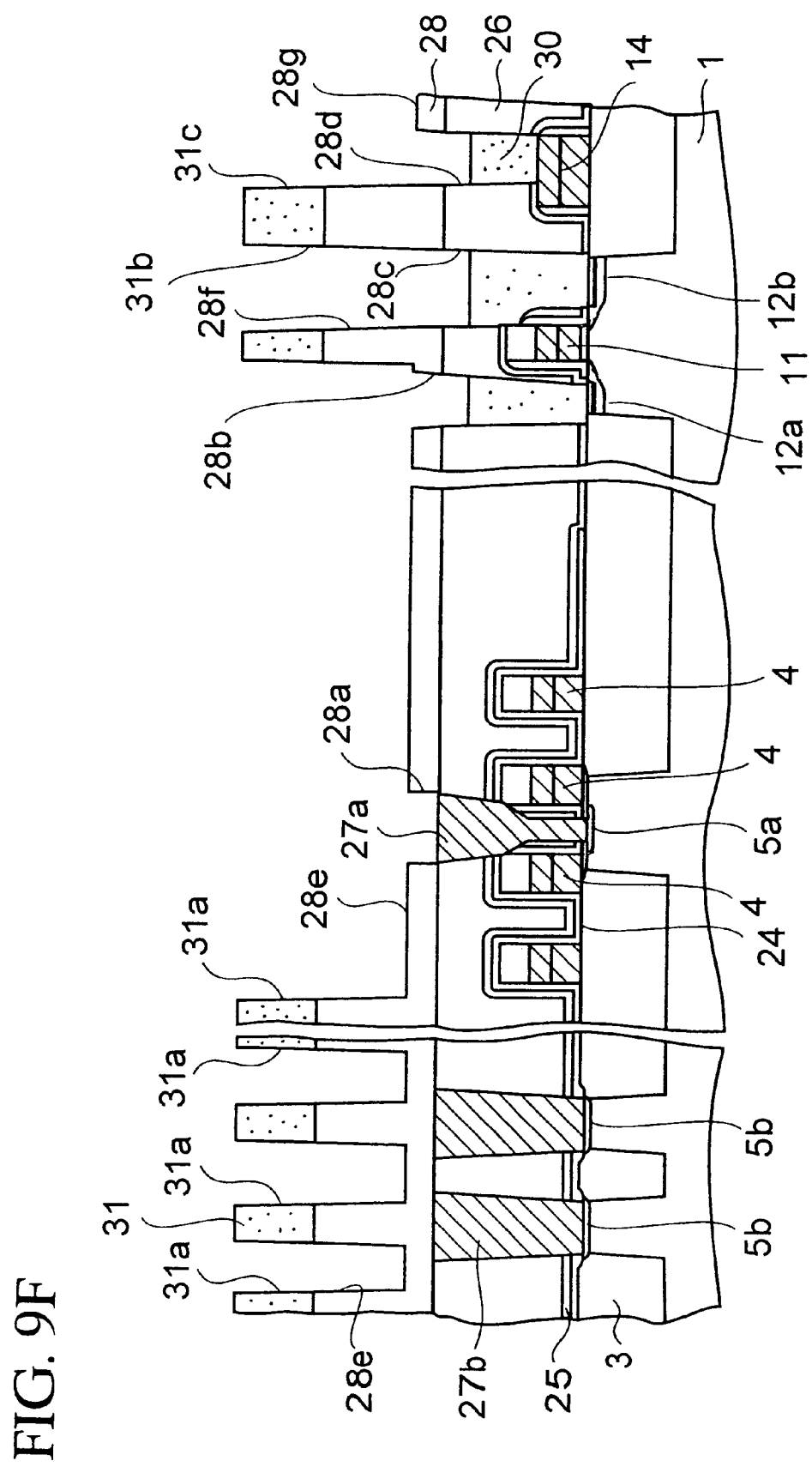

Next, as shown in FIG. 9F, openings 31a to 31c having a bit-line shape in the memory cell region A and a wiring shape in the peripheral circuit region B respectively are formed by coating newly a resist 31 on the second interlayer insulating film 28 and then exposing/developing it. Then, a plurality of wiring trenches 28e to 28g a part of which overlaps with the contact holes 28a to 28d are formed in the second interlayer insulating film 28 by etching the second interlayer insulating film 28 via the openings 31a to 31c. These wiring trenches 28e to 28g are formed to have substantially equal depths.

Then, the resist 31 and the organic material 30 are removed by the solvent. The depths of the wiring trenches 28e to 28g are set equal to a total thickness of a thickness of the bit line 6 and a desired thickness of the overlying silicon nitride film described later or a thicker thickness of desired film thicknesses of the wirings 13, 15 arranged only in the peripheral circuit region B. Such thickness is 200 to 300 nm, for example.

The wiring trench 28e in the memory cell region A has a pattern shape extended to the peripheral circuit region B.

Next, as shown in FIG. 9G, a third silicon nitride film 32 of 15 nm thickness is formed in the wiring trenches 28e to 28g and the contact holes 28a to 28d projected downward therefrom and on the second interlayer insulating film 28. Then, the third silicon nitride film 32 is removed from respective bottom portions of the wiring trenches 28e to 28g and the contact holes 28a to 28d but is left only on their side walls by etching back it in the vertical direction.

Then, a titanium (Ti) film 33a, a titanium nitride (TiN) film 33b, and a tungsten (W) film 33c are formed in sequence in the wiring trenches 28e to 28g and the contact holes 28a to 28d and on the second interlayer insulating film 28. These films 33a to 33c have a thickness to bury completely the wiring trenches 28e to 28g. For example, the Ti film 33a has a 20 nm thickness, the TiN film 33b has a 20 nm thickness, and the W film 33c has a 500 nm thickness.

Next, as shown in FIG. 9H, the Ti film 33a, the TiN film 33b, and the W film 33c are removed from the surface of the second interlayer insulating film 28 by the CMP method. As a result, the Ti film 33a, the TiN film 33b, and the W film 33c left in the wiring trench 28e that is continued from the memory cell region A to the peripheral circuit region B are used as the bit lines 6 and the first wiring 6a, whereas the Ti film 33a, the TiN film 33b, and the W film 33c left in the wiring trench 28f, 28g in the peripheral circuit region B are used as the second and third wirings 13, 15. The bit line 6 is connected to the landing pad 27a via the contact hole 28a in the memory cell region A, and also the first and second wirings 6a, 13 are connected to the impurity diffusion layers 12a, 12b via the contact holes 28b, 28c in the peripheral circuit region B respectively, and also the third wiring 15 is connected to the lower wiring 14 via the contact hole 28d.

The first wiring 6a in the peripheral circuit region B is extended into the memory cell region A and connected to the bit line 6.

Figures 9I, 9J:
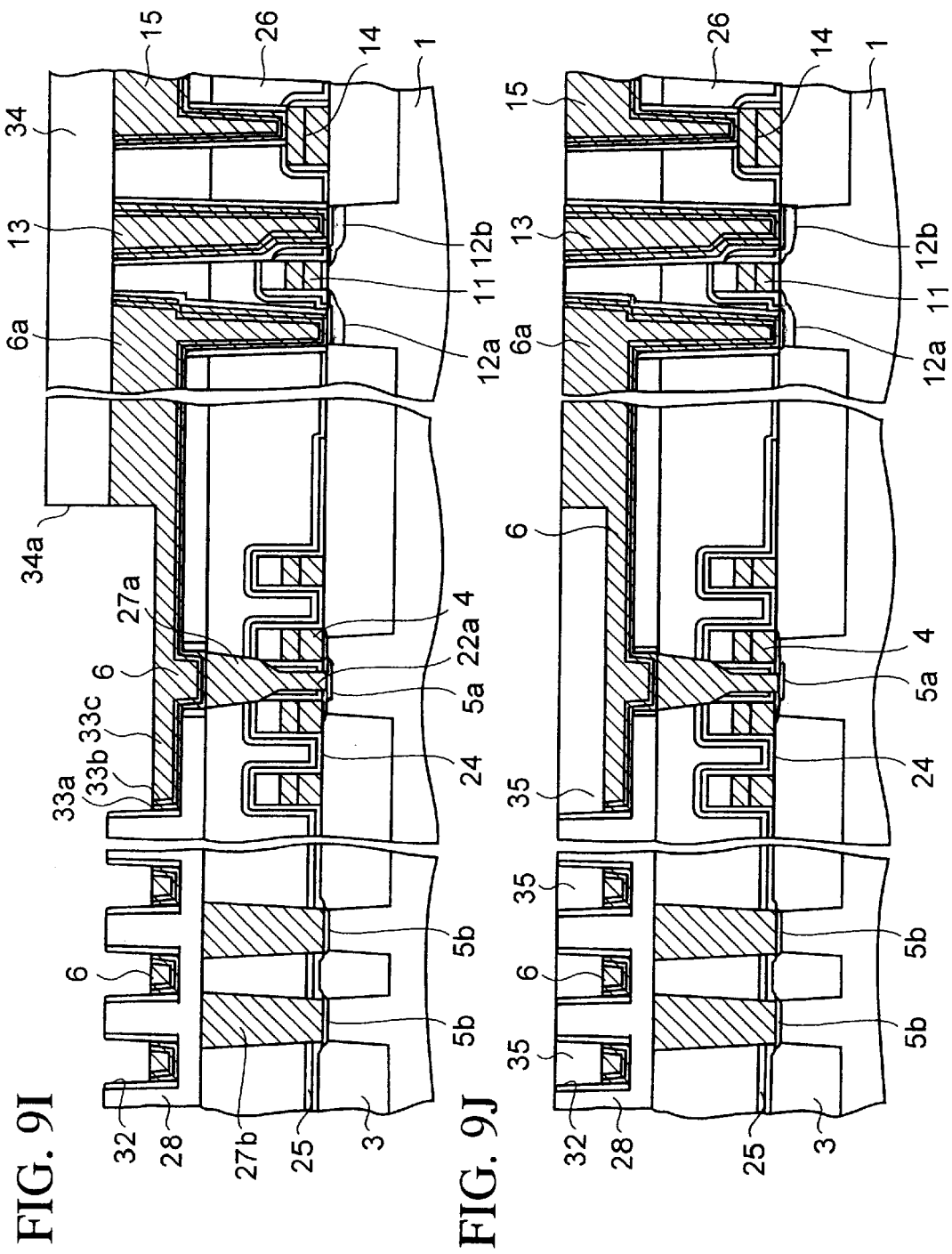

Next, as shown in FIG. 9I, an opening 34a to expose the bit lines 6 in the memory cell region A is formed by coating a resist 34 on the second interlayer insulating film 28, the bit lines 6, the first, second and third wirings 6a, 13, 15 and then exposing/developing it. This opening 34a has a shape to cover the bit line 6 on the peripheral portion of the memory cell region A in FIG. 9I, but a shape to expose the bit line 6 up to a boundary portion between the memory cell region A and the peripheral circuit region B may be formed.

Then, a trench is formed in the wiring trench 28e in the memory cell region A by etching back the W film 33c constituting the bit line 6 via the opening 34a while using a mixed gas containing sulfur hexafluoride ($SF_6$) and oxygen ($O_2$), for example, under the condition that the substrate temperature is set to less than 70° C. A depth of the etching-back is set to such extent that the bit line 6 has a thickness of 50 to 100 nm. Then, the TiN film 33b and the Ti film 33a exposed from the side wall of the wiring trench 28e in the memory cell region A are removed by the wet etching or the dry etching.

After the resist 34 is removed, a fourth silicon nitride film 35 is formed on the bit lines 6, the second interlayer insulating film 28, etc. A thickness of the fourth silicon nitride film 35 is set to such extent that the fourth silicon nitride film 35 is completely buried. Then, as shown in FIG. 9J, the fourth silicon nitride film 35 is polished by the CMP method until the wirings 6a, 13, 15 in the peripheral circuit region B are exposed, and the fourth silicon nitride film 35 is left on the bit line 6 in the wiring trench 28e in the memory cell region A. Accordingly, an upper surface and a side surface of the bit line 6 are covered with the third and fourth silicon nitride films 32, 35.

Figure 9K:
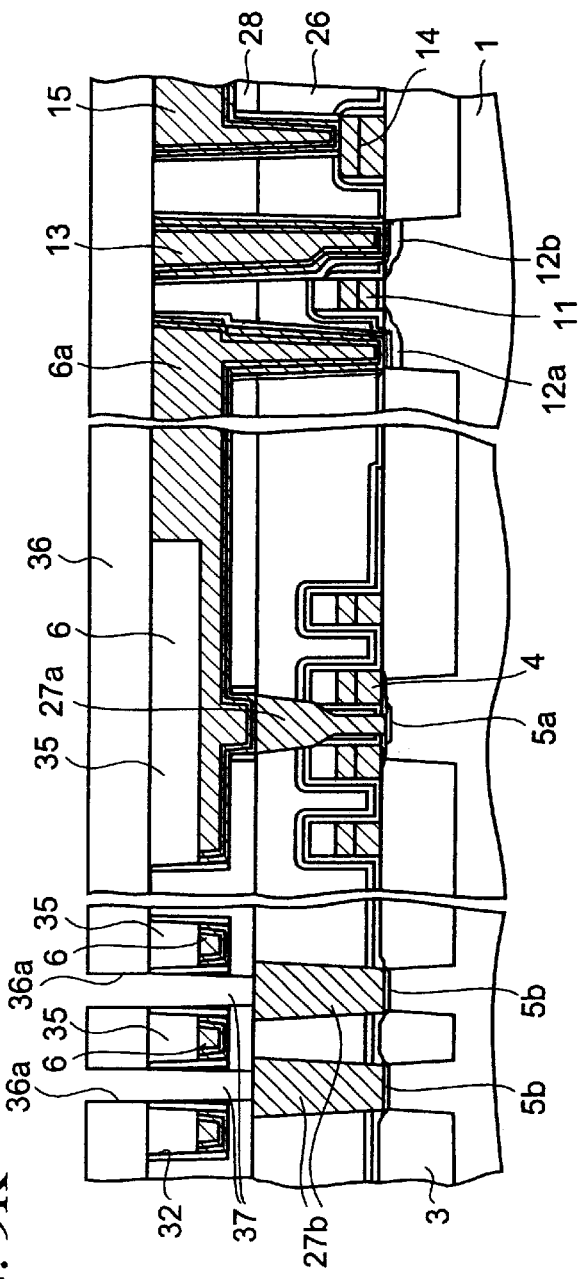

Then, as shown in FIG. 9K, openings 36a are formed over the impurity diffusion layer 5b near both ends of the active regions 2 in the memory cell region A by coating a resist 36 on the second interlayer insulating film 28, the bit lines 6, and the wirings 6a, 13, 15 and then exposing/developing it. The openings 36a are formed to position between the bit lines 6.

Then, upper contact holes 37 for the storage, that pass through between the bit lines 6 to reach the storage contact landing pads 27b, are formed by dry-etching the second interlayer insulating film 28 via the openings 36a while using the mixed gas containing $C_2F_8$ and $CH_2F_2$, for example, as the etching gas. That is, the upper contact holes 37 are formed by the self-align contact (SAC) method. Accordingly, even if forming positions of the upper contact holes 37 are displaced, the second interlayer insulating film 28 is selectively etched with respect to the third and fourth silicon nitride films 32, 35 covering the bit lines 6, and therefore contact between the bit lines 6 and the upper contact holes 37 can be prevented.

Figure 9L:
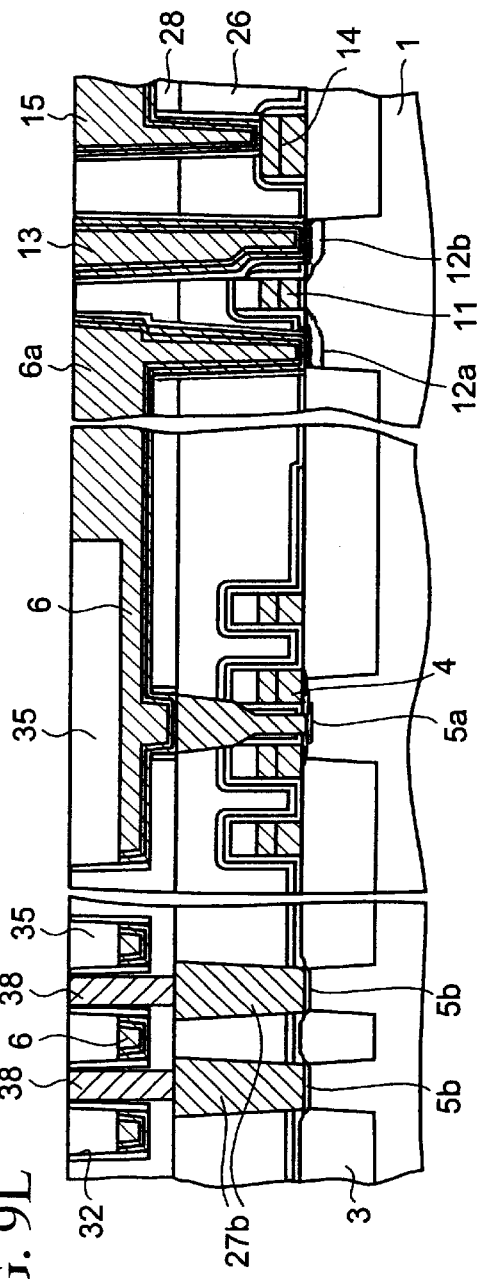

Further, a polysilicon film into which the n-type impurity is doped is formed in the upper contact holes 37 and on the second interlayer insulating film 28, and then the polysilicon film formed on the second interlayer insulating film 28, the wirings 6a, 13, 15, etc. is removed by the CMP method. Accordingly, as shown in FIG. 9L, the polysilicon films filled into the upper contact holes 37 are used as storage contact plugs 38.

Next, steps required to get a configuration shown in FIG. 9M will be explained hereunder.

First, a third interlayer insulating film 39 having a thickness of 100 nm and made of $SiO_2$ and a fifth silicon nitride film 40 of 50 nm thickness are formed in sequence on the second interlayer insulating film 28, the fourth silicon nitride film 35 and the wirings 6a, 13, 15, and then a BPSG film (not shown) of about 1.2 μm thickness is formed on the fifth silicon nitride film 40.

Then, concave portions 41 are formed in the capacitor forming portion of the memory cell region A by patterning the BPSG film (not shown), the fifth silicon nitride film 40, and the third interlayer insulating film 39 by virtue of the photolithography method. Then, amorphous silicon films are formed on inner surfaces of the concave portions 41 and an upper surface of the BPSG film. Then, the amorphous silicon film is removed from the upper surface of the BPSG film by the CMP method. In turn, uneven layers called HSG (HemiSpherical Grained silicon layer) are formed on inner surfaces of the amorphous silicon films by heating the amorphous silicon film in the vacuum. The amorphous silicon film is changed into the polysilicon film by such heating, and this polysilicon film is used as the storage electrode 42 of the capacitor Q. After this, the BPSG film is removed by the hydrofluoric acid.

In addition, dielectric films 43 are formed on surfaces of the storage electrodes 42 and the fifth silicon nitride film 40, and then opposing electrodes (cell plates) 44 made of doped silicon are formed on the dielectric films 43. Accordingly, the capacitors each consisting of the storage electrode 42, the dielectric films 43, and the opposing electrode 44 are formed.

In this case, the storage electrode 42, the dielectric films 43, and the fifth silicon nitride film 40 are selectively removed from the peripheral circuit region B by patterning them.

Next, steps required to get a configuration shown in FIG. 9N will be explained hereunder.

First, a fourth interlayer insulating film 45 covering the capacitors Q is formed on the third interlayer insulating film 39, and then upper contact holes 45a to 45c are formed on the first, second, and third wirings 6a, 13, 15 in the peripheral circuit region B respectively by patterning the third and fourth interlayer insulating film 39, 45. Then, a triple-layered film consisting of titanium, titanium nitride, and tungsten is filed into the contact holes 45a to 45c, and then this triple-layered film is used as plugs 46a to 46c. In addition, a titanium nitride film, an aluminum film, and a titanium nitride film are formed on the fourth interlayer insulating film 45, and then second-layer wirings 47a to 47c passing over the plugs 46a to 46c in the peripheral circuit region B are formed by patterning these films.

Then, a protection insulating film 48 covering the second-layer wirings 47a to 47c is formed on the fourth interlayer insulating film 45.

In the above semiconductor device, the wiring trenches 28e to 28g are formed in the second interlayer insulating film 28 in the memory cell region A and the peripheral circuit region B respectively. Then, the bit line 6 is formed in the wiring trench 28e in the memory cell region A, and also the wirings 6a, 13, 15 are formed in the wiring trenches 28e to 28g in the peripheral circuit region B. Then, the conductive film constituting the bit lines 6 is selectively etched to reduce its thickness, and then the fourth silicon nitride film 35 is formed in the wiring trench 28e and on the thinned bit line 6.

In this case, a plurality of wiring trenches 28e to 28g into which the bit lines 6 in the memory cell region A and the wirings 6a, 13, 15 in the peripheral circuit region B are buried are formed to have substantially equal depths. Also, the fourth silicon nitride film 35 for the self-align contact formed on the bit lines 6 are selectively formed on the thinned bit lines 6 and in the wiring trench 28c.

Accordingly, there is no necessity to form the etching stopper layer (silicon nitride film), that is used to differentiate the depths of the wiring trenches 28e in the memory cell region A and the peripheral circuit region B, between the first interlayer insulating film 26 and the second interlayer insulating film 28. In addition, the step of selectively etching the etching stopper layer is not needed and thus the reduction in throughput can be prevented.

Since the wirings 6a, 13, 15 in the peripheral circuit region B do not have a structure in which the same conductive film is formed by two separate steps, no contact interface exists in the same conductive film and thus the higher resistance of the conductive film is not caused. Out of the conductive film constituting the bit lines 6 and the wirings 6a, 13, 15, the titanium film 33a acts as an adhesive layer, and the titanium nitride film 33b acts as the barrier metal between the titanium film 33a and the tungsten film 33c.

Moreover, since the fourth silicon nitride film 35 covering the bit line 6 in the memory cell region A is buried only in the upper portion of the wiring trench 28e, the upper surface of the fourth silicon nitride films 35 is substantially equal in height to upper surfaces of the wirings 6a, 13, 15 in the peripheral circuit region B. Thus, since heights of upper surfaces of the storage contact holes 37 that are formed between a plurality of bit lines 6 by the self-align contact are set equal to heights of the wirings 6a, 13, 15 in the peripheral circuit region B, the storage contact holes 37 do not become higher than the wirings 6a, 13, 15. Therefore, the coverage of the conductive film buried in the storage contact holes 37 as the plug 38 can be improved.

Besides, since the fourth silicon nitride film 35 formed on the bit lines 6 is buried only in the upper portion of the wiring trench 28e that is the same as the bit lines 6, there is no necessity that the patterning of the fourth silicon nitride film 35 and the patterning of the bit lines 6 and the wirings 6a, 13, 15 should be carried out successively so as to uniformize the pattern shapes of the fourth silicon nitride film 35 and the bit lines 6. Thus, the tapering-off of the bit lines 6 due to the over-etching is not caused. Accordingly, the pattern precision of the bit lines 6 that are formed thinner than the wirings 6a, 13, 15 in the peripheral circuit region B can be improved.

The wiring resistance of the bit lines 6 in the memory cell region A is about 1.5 to 5 $\Omega$, but a bit-line capacitance is not increased because the film thickness is thin. In contrast, the wiring resistance of the wirings 6a, 13, 15 in the peripheral circuit region B is about 0.2 to 0.5 $\Omega$, and this value is sufficiently available for the wiring.

Second Embodiment

Figure 9M:
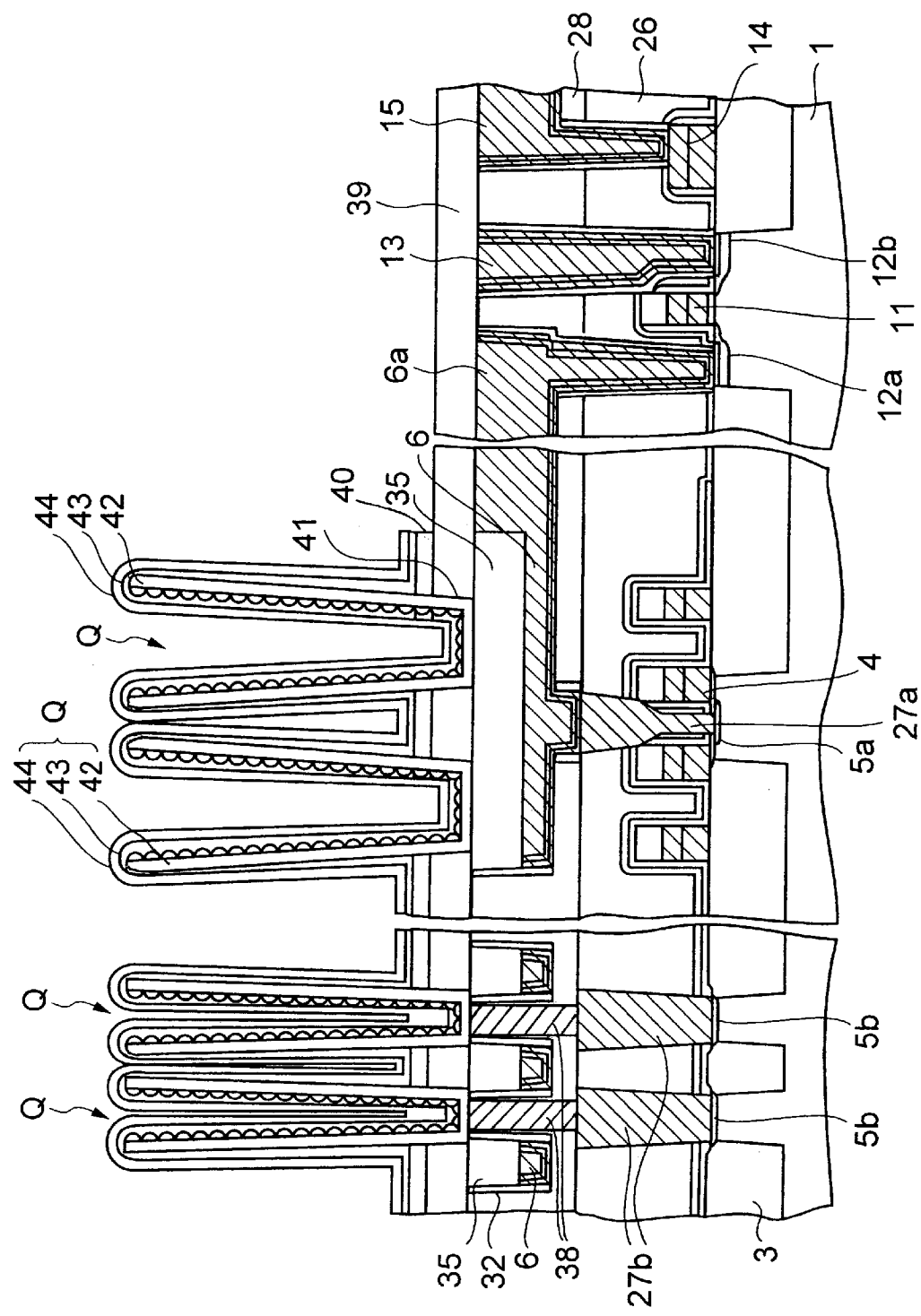

In the first embodiment, as shown in FIG. 9L and FIG. 9M, after the wirings 6a, 13, 15 in the peripheral circuit region B are exposed, the third interlayer insulating film 39 is formed on the wirings 6a, 13, 15, the second interlayer insulating film 28, etc.

In contrast, in the second embodiment, a structure not to expose these wirings 6a, 13, 15 after the fourth silicon nitride film 35 has been polished and a method of manufacturing the same are employed. Next, details of them will be explained hereunder.

As shown in FIG. 9I in the first embodiment, the trench is formed in the first wiring 6a by thinning the bit lines 6 in the situation that the peripheral circuit region B is covered with the resist 34.

Then, as shown in FIG. 10A, after the resist 34 is removed, the tungsten film 33c constituting the bit lines 6 in the memory cell region A and the wirings 6a, 13, 15 in the peripheral circuit region B is etched back by about 50 nm. The etching conditions of this etching-back are set almost equal to those being employed to form the trench in the first embodiment. However, twice etching times are adjusted such that the film thickness of the bit line 6 becomes finally about 100 nm. In addition, the titanium nitride film 33b and the titanium film 33a exposed on the side walls of the wiring trenches 28e to 28g are removed by the wet etching or the dry etching.

In turn, the fourth silicon nitride film 35 is formed on the second interlayer insulating film 28, the bit lines 6, and the wirings 6a, 13, 15. Then, as shown in FIG. 10B, the fourth silicon nitride film 35 is left only in the wiring trenches 28e to 28g by polishing it by virtue of the CMP method. Accordingly, the fourth silicon nitride film 35 is left on not only the bit lines 6 but also the wirings 6a, 13, 15, but its thickness becomes thickest on the bit lines 6.

Figure 10C:
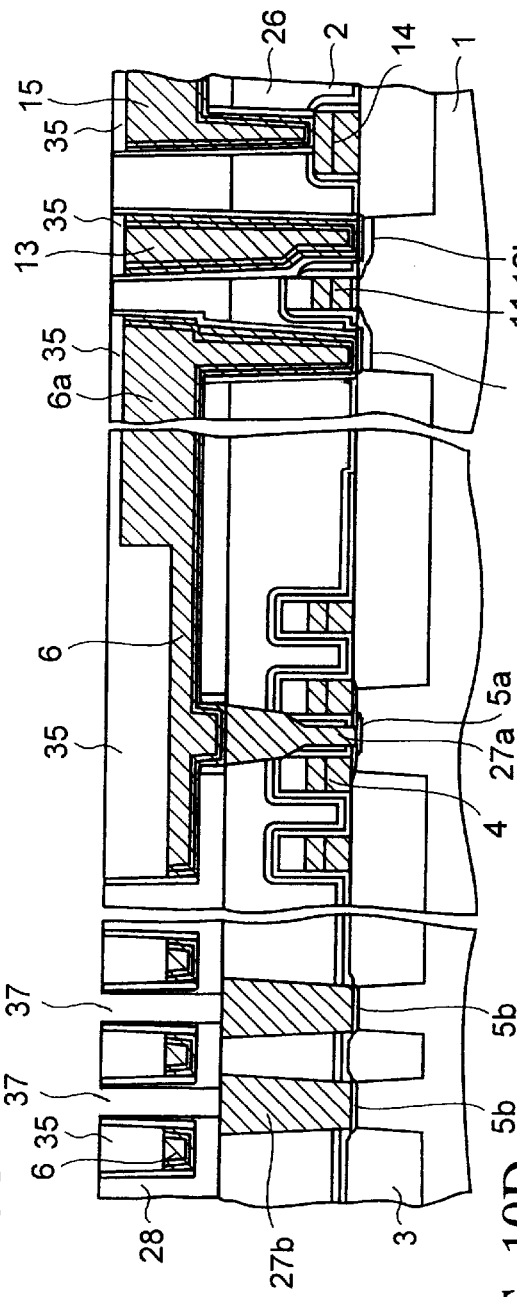
Figure 10D:
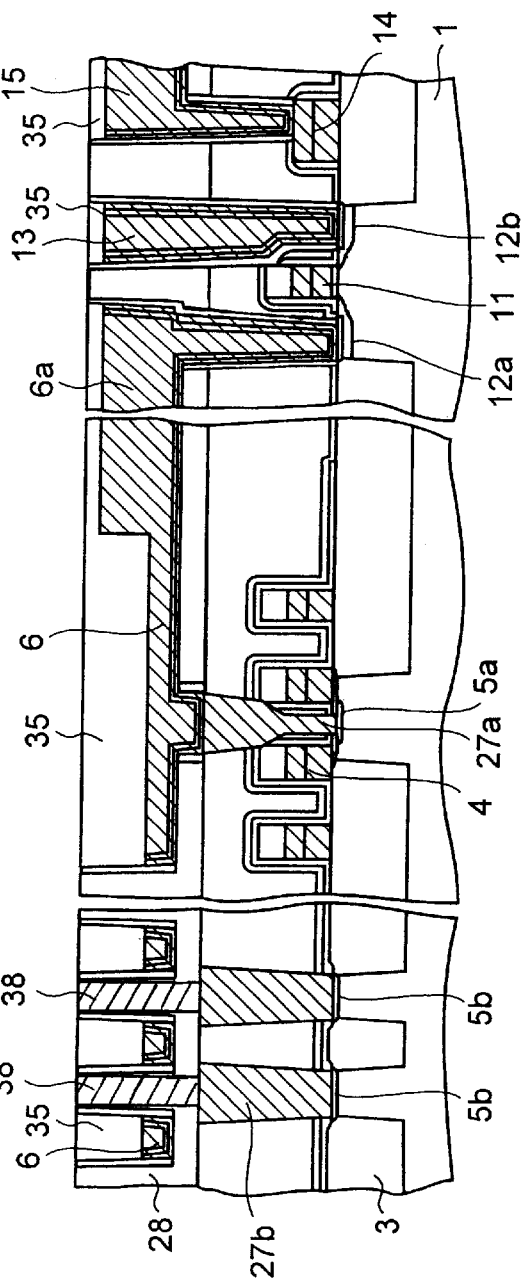

Then, as shown in FIG. 10C, the storage contact holes 37 passing through between the bit lines 6 in the memory cell region A are formed in the second interlayer insulating film 28. Then, as shown in FIG. 10D, the plugs 38 are filled into the storage contact holes 37. The same method as that shown in FIGS. 9K and 9L in the first embodiment is employed to form the storage contact holes 37 and the plugs 38. The contact between the storage contact holes 37 and the bit lines 6 can be prevented by the third and fourth silicon nitride films 32, 35.

Figure 10E:
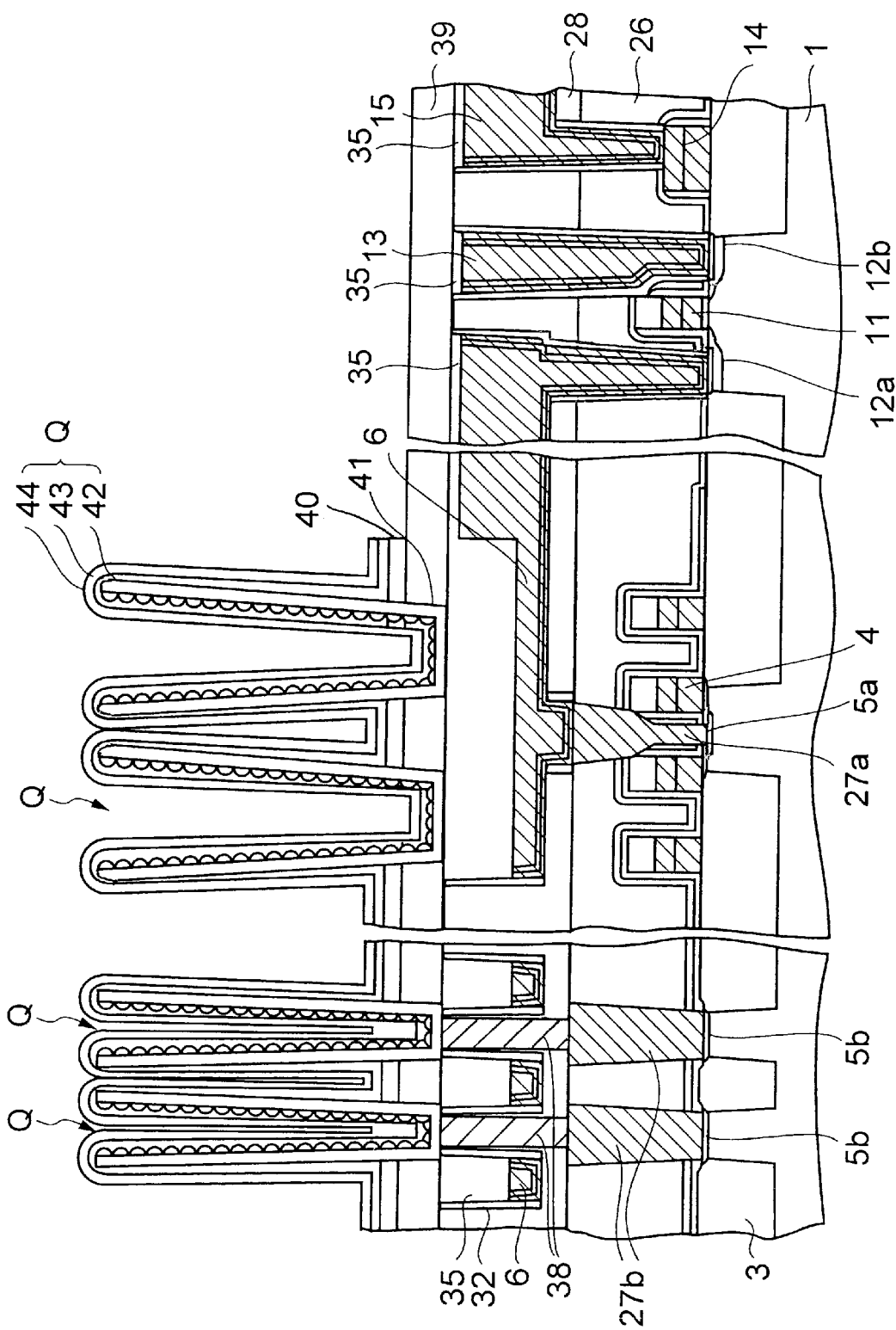

After this, as shown in FIG. 10E, the third interlayer insulating film 39 covering the plugs 38 and the fourth silicon nitride film 35 is formed on the second interlayer insulating film 28. Then, after the fifth silicon nitride film 40 is formed on the third interlayer insulating film 39, the capacitors Q are formed by the same method as the first embodiment.

Figure 10F:
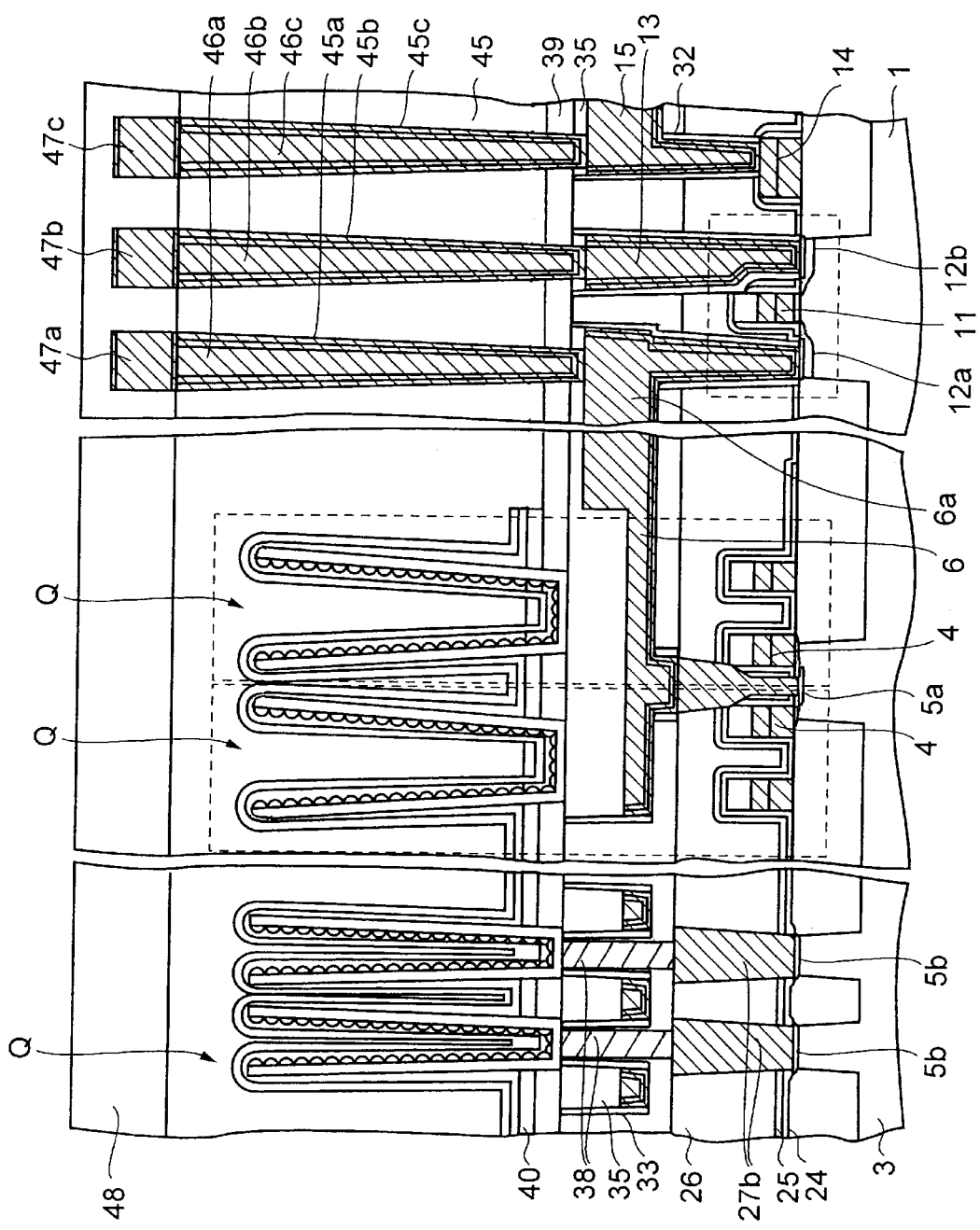

Then, as shown in FIG. 10F, the fourth interlayer insulating film 45 covering the capacitors Q is formed by the same method as the first embodiment, then the upper contact holes 45a to 45c are formed in the third and fourth interlayer insulating films 39, 45 in the peripheral circuit region B, then the plugs 46a to 46c are formed in the contact holes 45a to 45c, then the wirings 47a to 47c are formed on the fourth interlayer insulating film 45, and then the protection insulating film 48 covering the wirings 47a to 47c is formed.

However, if the upper contact holes 45a to 45c are formed in the third and fourth interlayer insulating films 39, 45, the etching of the fourth silicon nitride film 35 on the wirings 6a, 13, 15 in the peripheral circuit region B cannot be substantially proceeded. Therefore, the wirings 6a, 13, 15 must be exposed by etching the fourth silicon nitride film 35 by using the different etchant.

According to the semiconductor device as described above, like the first embodiment, the drawback in the prior art can be overcome. In addition, in the semiconductor device, since the fourth silicon nitride film 35 is left on not only the bit lines 6 but also the wirings 6a, 13, 15 in the peripheral circuit region B thin, the structure not to expose the wirings 6a, 13, 15 after the fourth silicon nitride film 35 has been polished can be obtained. Hence, there can be achieved such an advantage that erosion of the tungsten film 33c expected in executing the CMP of the fourth silicon nitride film 35 can be prevented to then uniformize the resistances of the wirings 6a, 13, 15.

In this case, the memory cell region A and the peripheral circuit region B having the structure shown in FIG. 10A to FIG. 10F have the same planar configuration as that in FIG. 8.

Third Embodiment

In the second embodiment, the erosion of the wirings 6a, 13, 15 in polishing the fourth silicon nitride film 35 can be prevented by leaving the fourth silicon nitride film 35 thin on the wirings 6a, 13, 15 in the wiring trenches 28e to 28g.

On the contrary, in the third embodiment, a structure and steps that can prevent the erosion of the wirings 6a, 13, 15 by a method different from the second embodiment are employed. Their details will be explained hereunder.

First, as shown in FIG. 9G in the first embodiment, the bit lines 6 and the wirings 6a, 13, 15 are formed in the wiring trenches 28e to 28g.

Figure 11A:
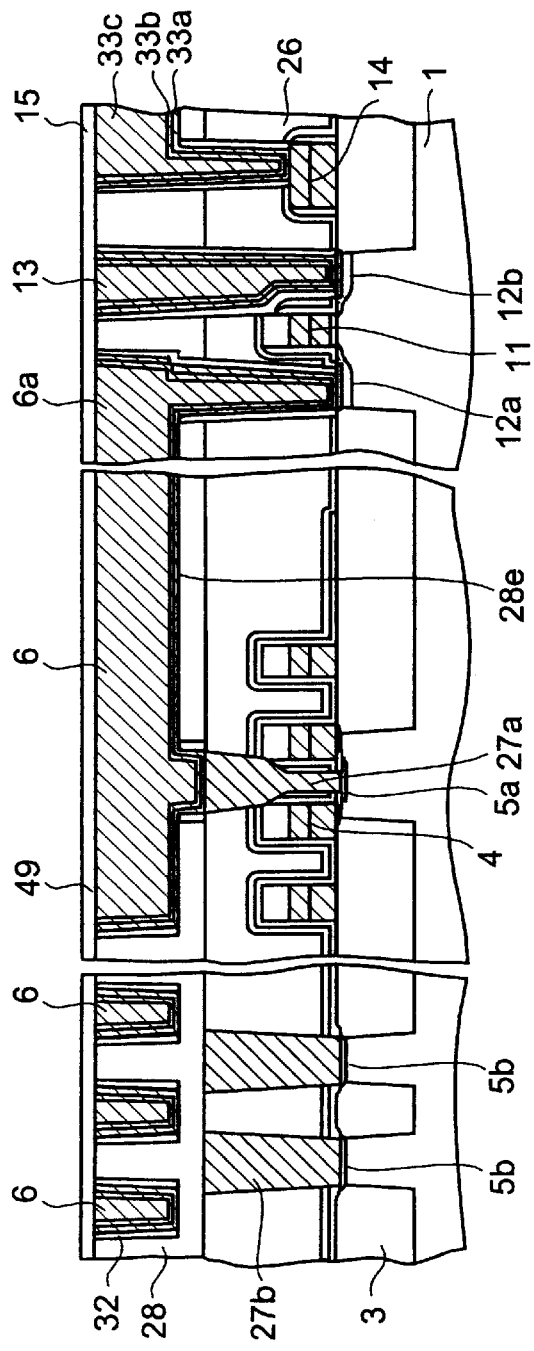

Then, as shown in FIG. 11A, an $SiO_2$ film 49 of 50 nm thickness is formed on the bit lines 6, the wirings 6a, 13, 15 and the second interlayer insulating film 28 by the CVD method.

Figure 11B:
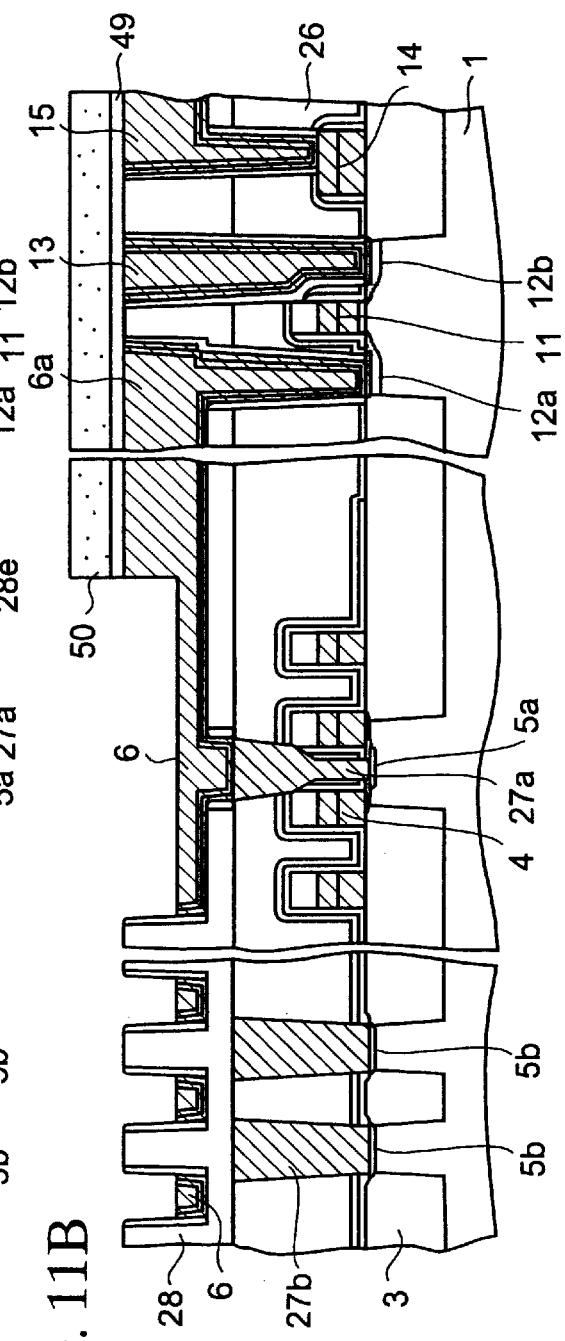

Then, a resist 50 covering the $SiO_2$ film 49 in the peripheral circuit region B is formed. Then, as shown in FIG. 11B, the bit lines 6 in the memory cell region A are exposed by etching the $SiO_2$ film 49 by virtue of the reactive ion etching method using the mixed gas containing C4F8 and CH2F2 while using the resist 50 as a mask. Then, trenches are formed by etching the bit lines 6 after the etching gas is changed. The bit lines 6 are thinned up to a thickness of about 100 nm by setting the etching conditions of the bit lines 6 like the first embodiment.

Figure 11C:
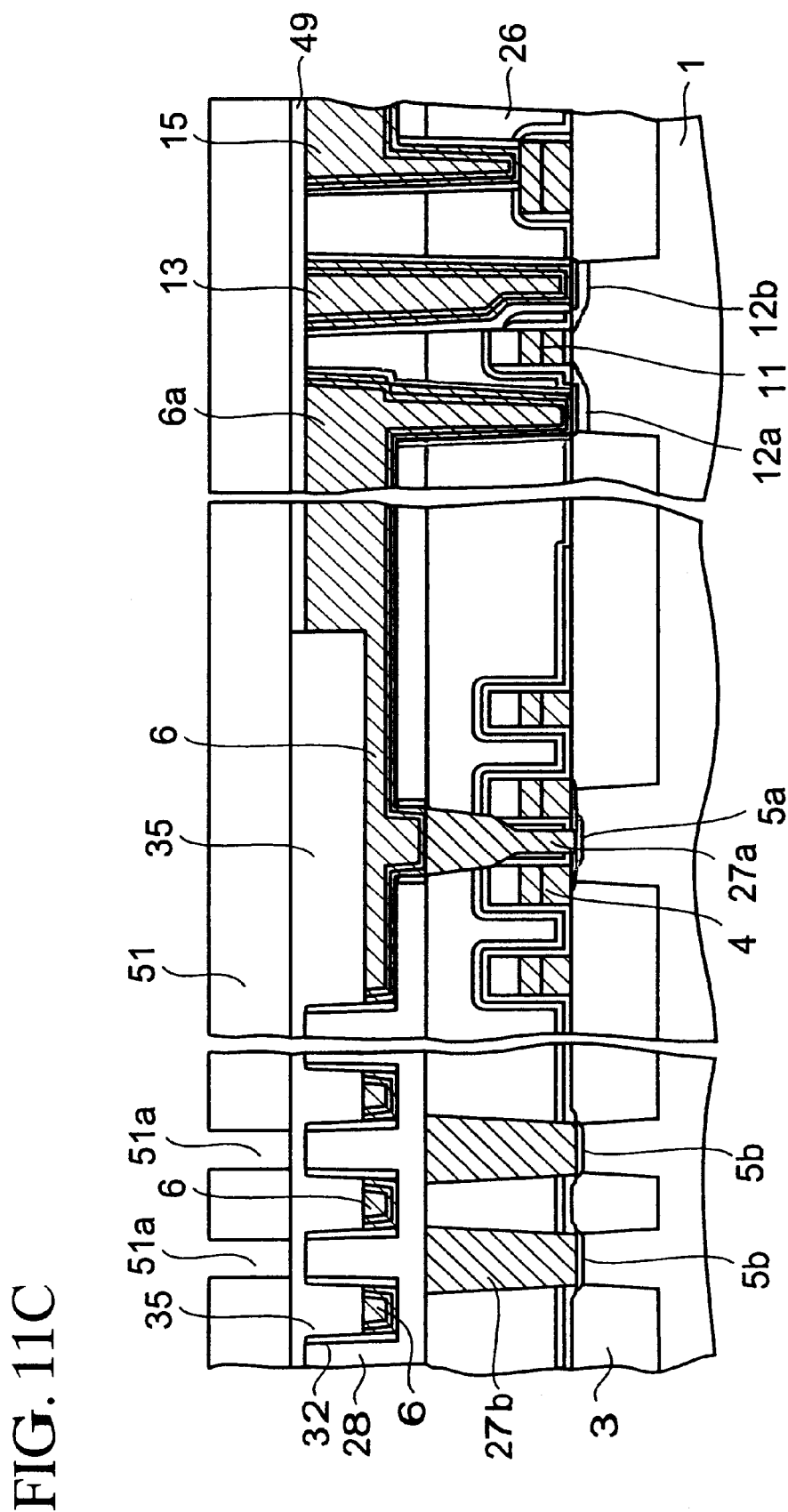

Next, steps required to get a configuration shown in FIG. 11C will be explained hereunder.

First, the fourth silicon nitride film 35 is formed on the $SiO_2$ film 49, the second interlayer insulating film 28, the bit lines 6, and the wirings 6a, 13, 15 by the CVD method. Then, as shown in FIG. 11C, the fourth silicon nitride film 35 is selectively removed from an upper surface of the $SiO_2$ film 49 in the peripheral circuit region B by polishing it by virtue of the CMP method. In this case, since the $SiO_2$ film 49 acts as a polishing stopper film, the fourth silicon nitride film 35 is left thin in the wiring trench 28e in the memory cell region A and on the second interlayer insulating film 28 in the memory cell region A.

In turn, openings 51a are formed on the storage contact landing pads 27b by coating a resist 51 on the $SiO_2$ film 49 and the fourth silicon nitride film 35 and then exposing/developing it.

Then, storage contact holes 37a are formed by etching the second interlayer insulating film 28 and the fourth silicon nitride film 35 via the openings 51a. In this case, the fourth silicon nitride film 35 and the second interlayer insulating film 28 are etched after the etching conditions are changed.

Figure 11D:
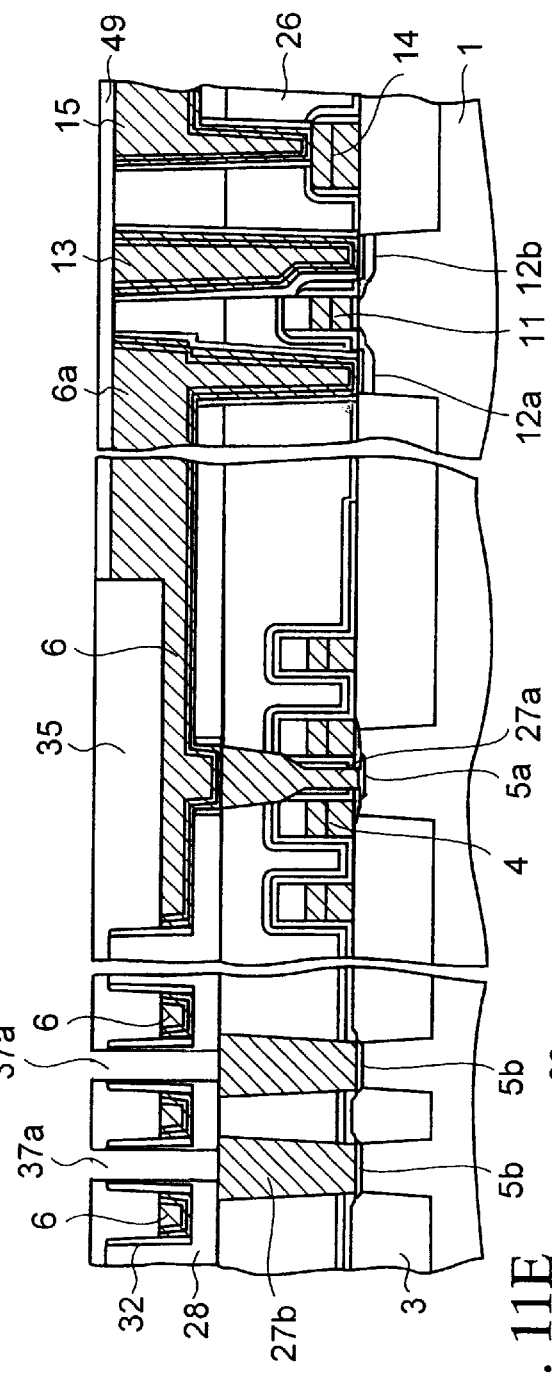

A sectional shape shown in FIG. 11D can be obtained after the resist 51 is removed.

Figure 11E:
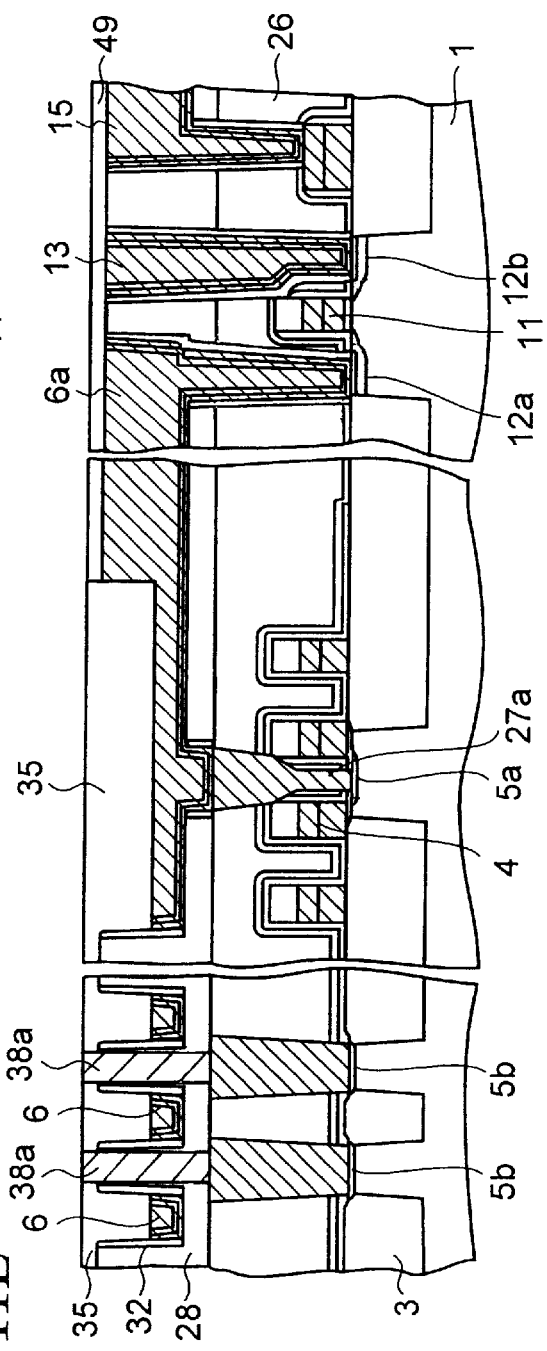

Then, a doped polysilicon film is formed such that it can be perfectly filled into the storage contact holes 37a, and then the doped polysilicon film formed on the fourth silicon nitride film 35 and the $SiO_2$ film 49 is polished by the CMP method but left only in the storage contact holes 37a. As shown in FIG. 11E, the doped polysilicon film left in the storage contact holes 37a is used as storage contact plugs 38a.

By the way, the storage contact holes 37a are formed thicker than the storage contact holes 37 in the first and second embodiments by a film thickness of the $SiO_2$ film 49. But such film thickness is not so thick to deteriorate coverage of the storage contact plugs 38a being filled in the storage contact holes 37.

Also, in the memory cell region A, the fourth silicon nitride film 35 formed on the bit lines 6 is formed not only in the wiring trench 28e but also on the second interlayer insulating film 28 around the wiring trench 28e. Therefore, upon etching to form the storage contact holes 37a, first the fourth silicon nitride film 35 is control-etched by the thickness being left on the second interlayer insulating film 28, and then the second interlayer insulating film 28 is etched. Then, since the etching of the fourth silicon nitride film 35 formed immediately on the bit lines 6 can be prevented upon selectively etching the second interlayer insulating film 28, the storage contact holes 37a can be formed in the self-alignment manner, like the first embodiment.

Next, steps required to get a configuration shown in FIG. 11F will be explained hereunder.

First, the third interlayer insulating film 39 is formed on the storage contact plugs 38a, the fourth silicon nitride film 35, and the $SiO_2$ film 49. Then, the fifth silicon nitride film 40 is formed on the third interlayer insulating film 39, and the capacitors Q are formed by the same method as the first embodiment.

Then, the fourth interlayer insulating film 45 covering the capacitors Q is formed by the same method as the first embodiment, then the upper contact holes 45a to 45c are formed in the third and fourth interlayer insulating films 39, 45, and the $SiO_2$ film 49 in the peripheral circuit region B, then the plugs 46a to 46c are formed in the contact holes 45a to 45c, then the wirings 47a to 47c are formed on the fourth interlayer insulating film 45, and then the protection insulating film 48 covering the wirings 47a to 47c is formed.

According to the above semiconductor device, like the first embodiment, the drawbacks in the prior art can be overcome. In addition, in the semiconductor device, the fourth silicon nitride film 35 is formed on the overall surface in the situation that the wirings 6a, 13, 15 in the peripheral circuit region B are covered with the $SiO_2$ film 49, and then the fourth silicon nitride film 35 is selectively polished. Therefore, there can be obtained the structure not to expose the wirings 6a, 13, 15 after the fourth silicon nitride film 35 is polished. Accordingly, there can be achieved the advantages such that the erosion of the tungsten film 33c, that is expected in polishing the fourth silicon nitride film 35, can be prevented and thus the resistances of the wirings 6a, 13, 15 can be uniformized.

In this case, the memory cell region A and the peripheral circuit region B having the structure shown in FIG. 11A to FIG. 11F have the same planar configuration as that in FIG. 8.

Fourth Embodiment

In the semiconductor device according to the first, second, and third embodiments, the bit lines and the wirings are formed by the dual damascene method. In the fourth embodiment, steps of forming the bit lines and the wirings by the single damascene method will be explained hereunder.

First, as shown in FIG. 9C of the first embodiment, the landing pads 27a, 27b are formed in the contact holes 26a, 26b in the first interlayer insulating film 26 in the memory cell region A.

Figure 12A:
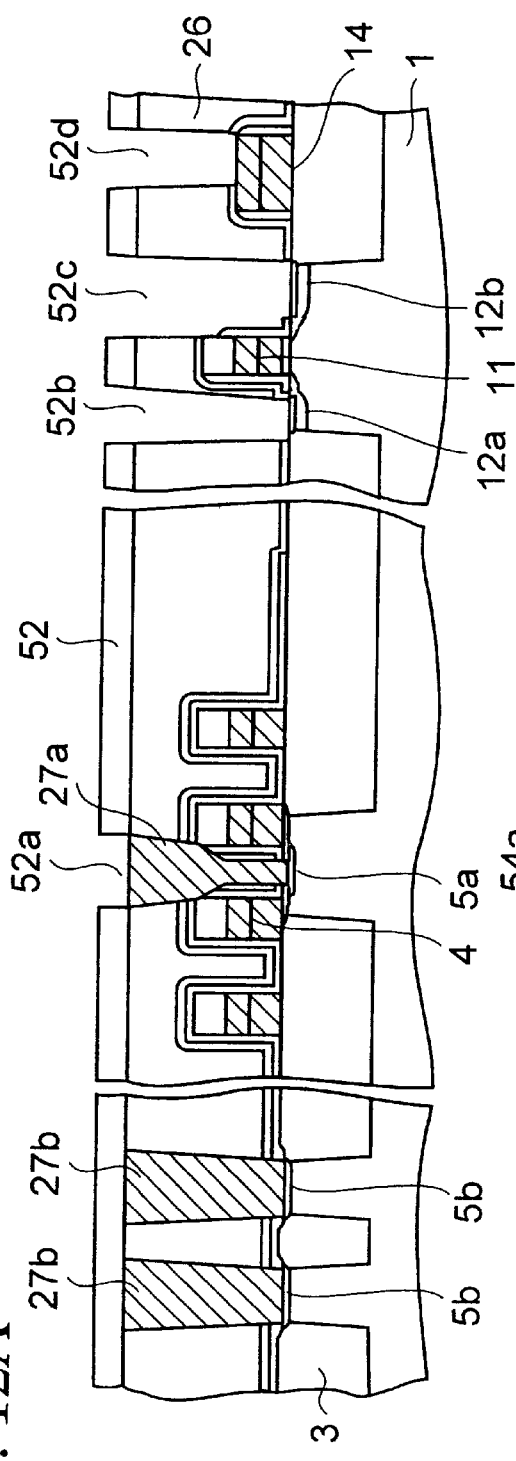

Next, steps required to get a configuration shown in FIG. 12A will be explained hereunder.

First, an SiO$_2$ film 52 is formed on the landing pads 27a, 27b and the first interlayer insulating film 26 by the CVD method to have a thickness of 100 nm.

Then, the first interlayer insulating film 26 and the SiO$_2$ film 52 are patterned by the photolithography method, and thus first to fourth contact holes 52a to 52d are formed to reach the landing pad 27a in the memory cell region A and the impurity diffusion layers 12a, 12b and the lower wiring 14 in the peripheral circuit region B respectively. In this case, since the second silicon nitride film 25 functions as the etching stopper layer, etching of the device isolation insulating layer 3 can be prevented even if depths of the first to fourth contact holes 52a to 52d are different. Then, the second silicon nitride film 25 under the first to fourth contact holes 52a to 52d is selectively etched after the reaction gas is changed.

Figure 12B:
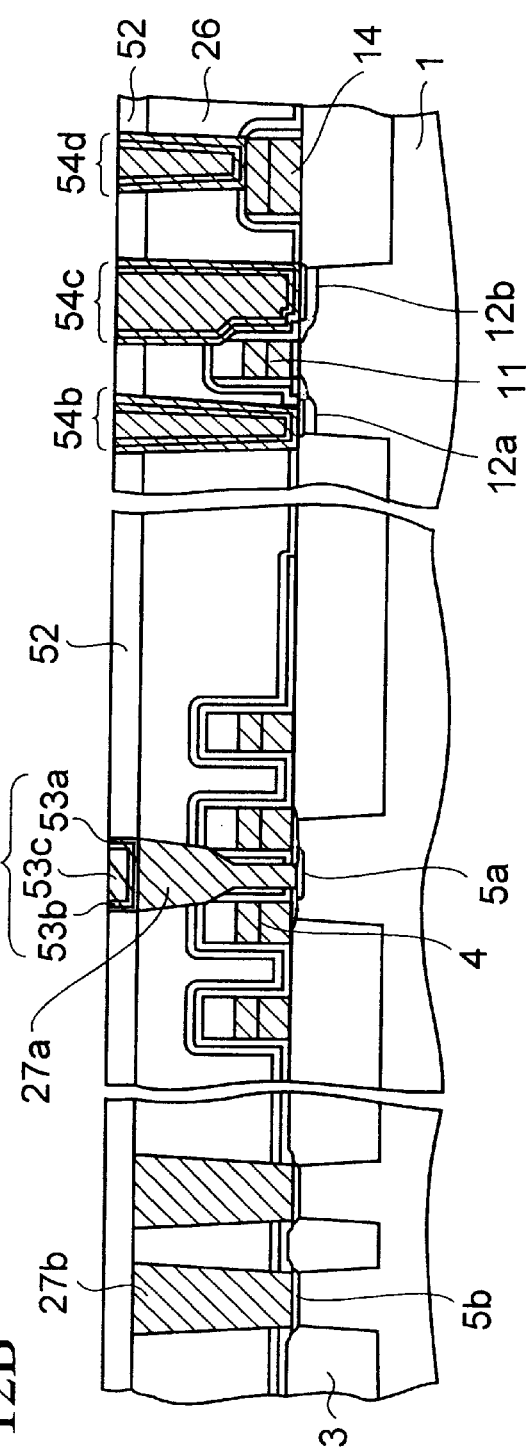

Next, steps required to get a configuration shown in FIG. 12B will be explained hereunder.

First, a Ti film 53a of 20 nm thickness, a TiN film 53b of 20 nm thickness, and a W film 53c of 200 nm thickness are formed in sequence in the first to fourth contact holes 52a to 52d and on the first interlayer insulating film 26. The tungsten film 53c has a thickness that can bury completely the second and fourth contact holes 52b to 52d in the peripheral circuit region B.

Then, the Ti film 53a, the TiN film 53b, and the W film 53c on the first interlayer insulating film 26 are removed by the CMP method.

Accordingly, a bit-line contact pad 54a consisting of the Ti film 53a, the TiN film 53b, and the W film 53c is formed on the bit-line landing pad 27a in the memory cell region A. Also, first layer contact plugs 54b to 54d each consisting of the Ti film 53a, the TiN film 53b, and the W film 53c are formed on the impurity diffusion layers 12a, 12b and the lower wiring 14 in the peripheral circuit region B respectively.

Figure 12C:
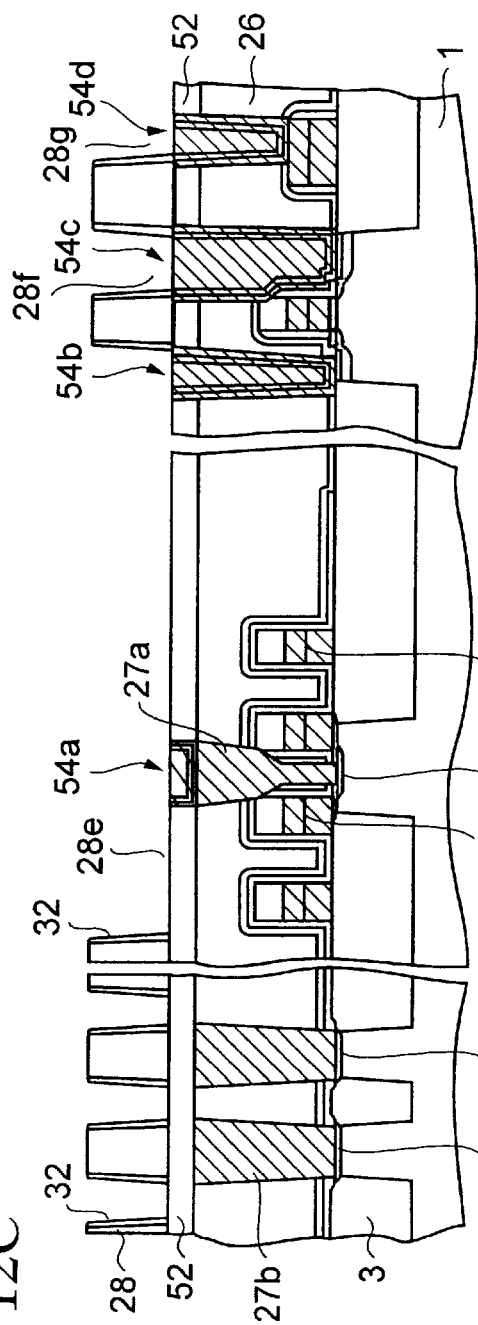

Next, steps required to get a configuration shown in FIG. 12C will be explained hereunder.

First, the second interlayer insulating film 28 made of SiO$_2$ is formed on the SiO$_2$ film 52 and the contact plugs 54b to 54d to have a film thickness of 200 to 300 nm. Then, the wiring trenches 28e to 28g, that have a bit-line shape in the memory cell region A and a wiring shape in the peripheral circuit region B, are formed by patterning the second interlayer insulating film 28 by means of the photolithography method. These wiring trenches 28e to 28g are formed to reach the contact plugs 54a to 54d.

Here, the wiring trench 28e in the memory cell region A has a pattern shape extended into the peripheral circuit region B.

Then, the third silicon nitride film 32 is formed on inner surfaces of the wiring trenches 28e to 28g, and then the third silicon nitride film 32 is left only on side walls of the wiring trenches 28e to 28g by etching it in the vertical direction.

Figure 12D:
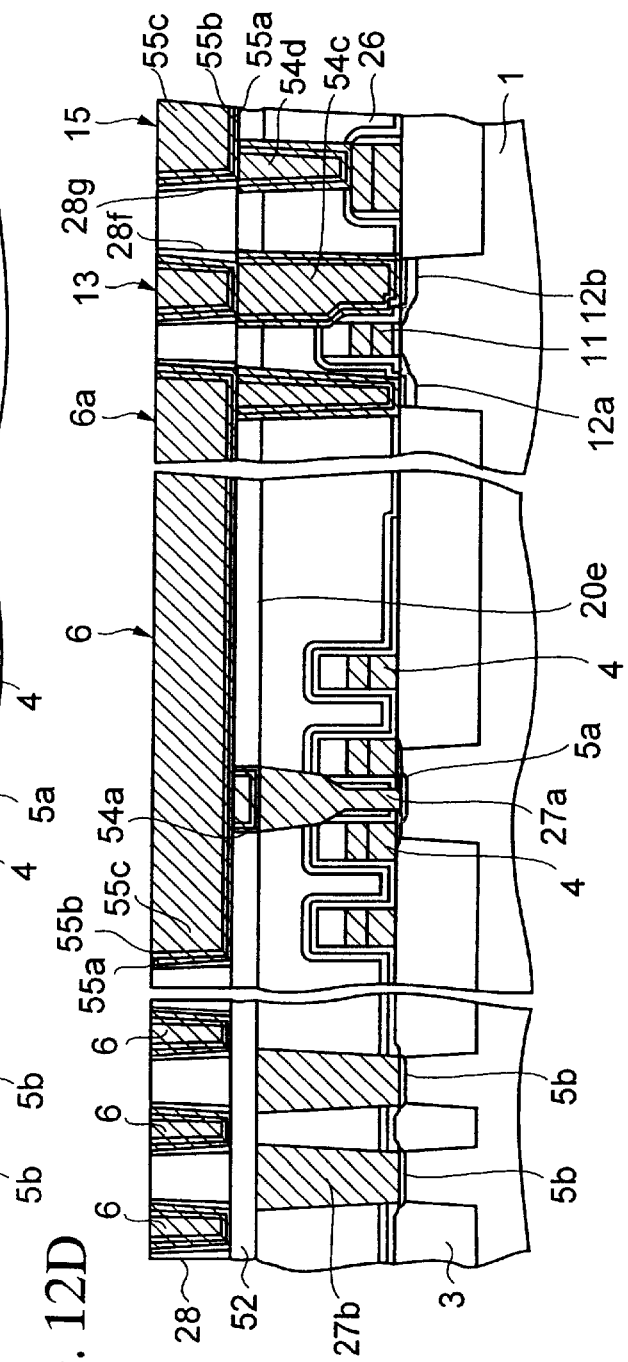

Next, steps required to get a configuration shown in FIG. 12D will be explained hereunder.

First, a Ti film 55a, a TiN film 55b, and a W film 55c are formed in sequence in the wiring trenches 28e to 28g and on the second interlayer insulating film 28. For example, a film thickness of the Ti film 55a is set to 20 nm, a film thickness of the TiN film 55b is set to 20 nm, and a film thickness of the W film 55c is set to completely bury the wiring trenches 28e to 28g.

Then, the Ti film 55a, the TiN film 55b, and the W film 55c are removed from a surface of the second interlayer insulating film 28 by the CMP method. Accordingly, the Ti film 55a, the TiN film 55b, and the W film 55c being left in the wiring trench 28e continued from the memory cell region A to the peripheral circuit region B are used as the bit lines 6 and the first wiring 6a, and also the Ti film 55a, the TiN film 55b, and the W film 55c being left in the wiring trenches 28f, 28g in the peripheral circuit region B are used as the second and third wirings 13, 15.

Accordingly, in the memory cell region A, the bit line 6 is connected to the landing pad 27a via the bit-line contact plug 54. Also, in the peripheral circuit region B, the first and second wirings 6a, 13 are connected to the impurity diffusion layers 12a, 12b via the first layer contact plugs 54b, 54c respectively, and also the third wiring 15 is connected to the lower wiring 14 via the first layer contact plug 54d. The first wiring 6a in the peripheral circuit region B is extended into the memory cell region A and then connected to the bit line 6.

Then, as shown in FIG. 12E, a trench is formed in the wiring trench 28e in the memory cell region A by etching back the W film 55c constituting the bit line 6 in the situation that the first, second, and third wirings 6a, 13, 15 in the peripheral circuit region B are covered with a resist 56. A depth of this etching-back is set to such extent that the bit line 6 has a thickness of 50 to 100 nm. Then, the TiN film 55b and the Ti film 55a exposed from the side wall of the wiring trench 28e in the memory cell region A are removed by the wet etching or the dry etching.

In FIG. 12E, the trench is formed on the inner side portion of the bit line 6 rather than the outer edge portion of the memory cell region A. But the trench may be formed to a region reaching the boundary between the memory cell region A and the peripheral circuit region B.

Then, the fourth silicon nitride film 35 is formed on the bit lines 6, the second interlayer insulating film 28, etc. Then, as shown in FIG. 12F, the fourth silicon nitride film 35 is polished by the CMP method until the wirings 6a, 13, 15 in the peripheral circuit region B are exposed, and also the fourth silicon nitride film 35 is left on the bit lines 6 in the wiring trench 28e in the memory cell region A. As a result, upper surfaces and side surfaces of the bit lines 6 are covered with the third and fourth silicon nitride films 32, 35.

Figure 12G:
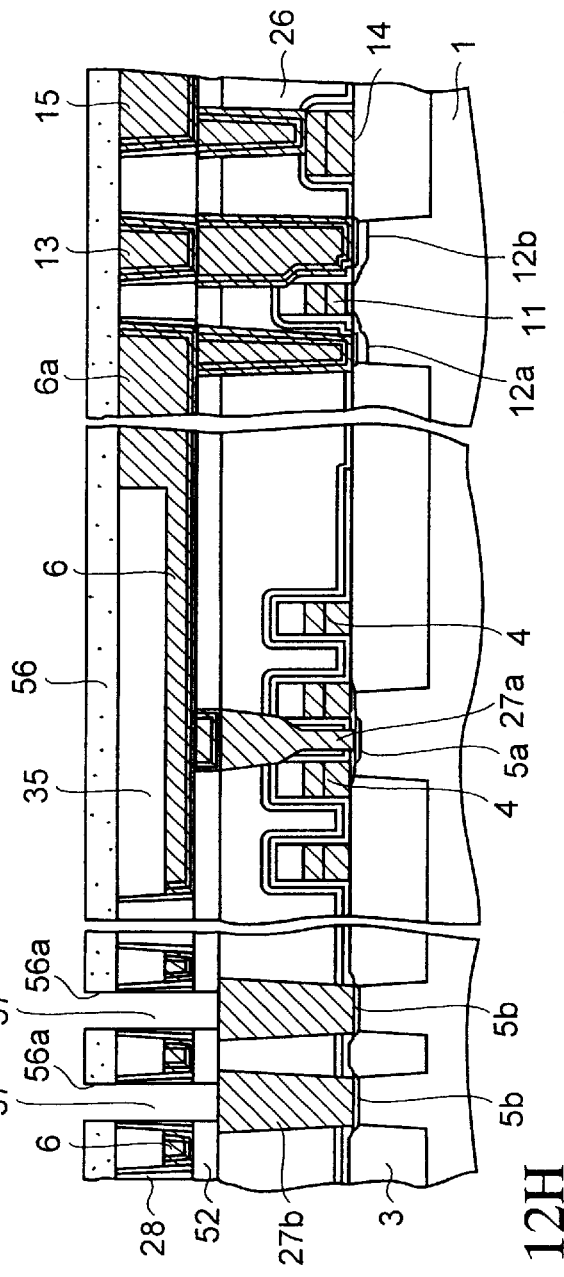

Then, as shown in FIG. 12G, openings 56a are formed over the storage-contact landing pads 27b in the memory cell region A by coating the resist 56 on the second interlayer insulating film 28, the bit lines 6, and the wirings 6a, 13, 15 and then exposing/developing it. The openings 56a are positioned between the bit lines 6.

Then, the upper contact holes 37 for the storage, that pass through between the bit lines 6 to reach the storage-contact landing pads 27b, are formed by dry-etching the second interlayer insulating film 28 while using the resist 56 as a mask. In this case, even if forming positions of the upper contact holes 37 are displaced, the second interlayer insulating film 28 can be selectively etched with respect to the third and fourth silicon nitride films 32, 35, and therefore contact between the bit lines 6 and the upper contact holes 37 can be prevented.

Figure 12H:
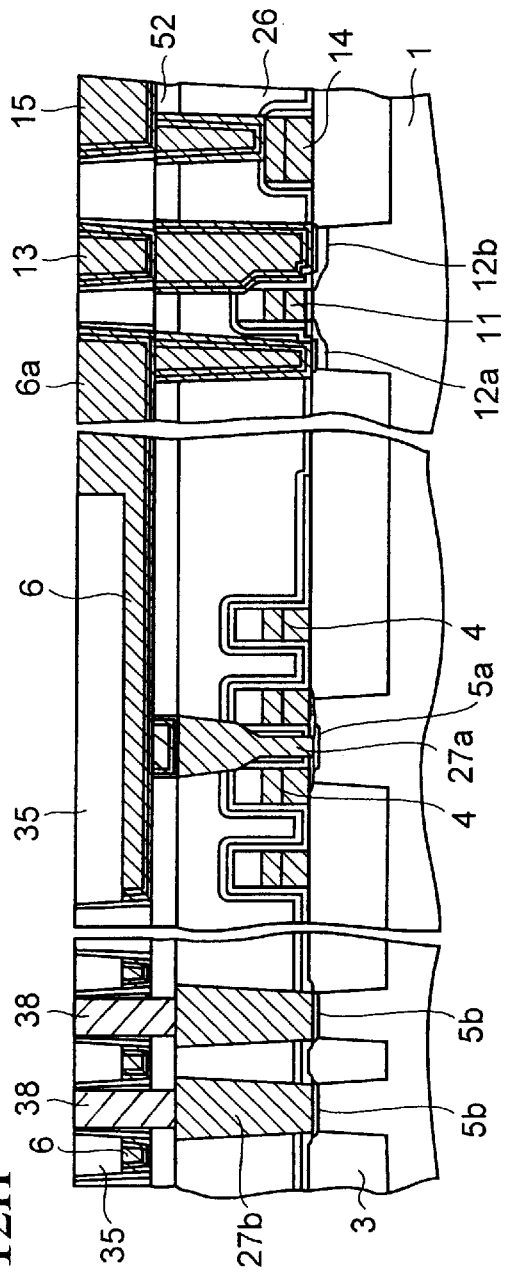

Then, the resist 56 is removed and then the polysilicon film into which the n-type impurity is doped is formed in the upper contact holes 37 and the second interlayer insulating film 28. Then, the polysilicon film on the second interlayer insulating film 28 is removed by the CMP method. Accordingly, as shown in FIG. 12H, the polysilicon films being left in the upper contact holes 37 are used as storage contact plugs 38.

Figure 12I:
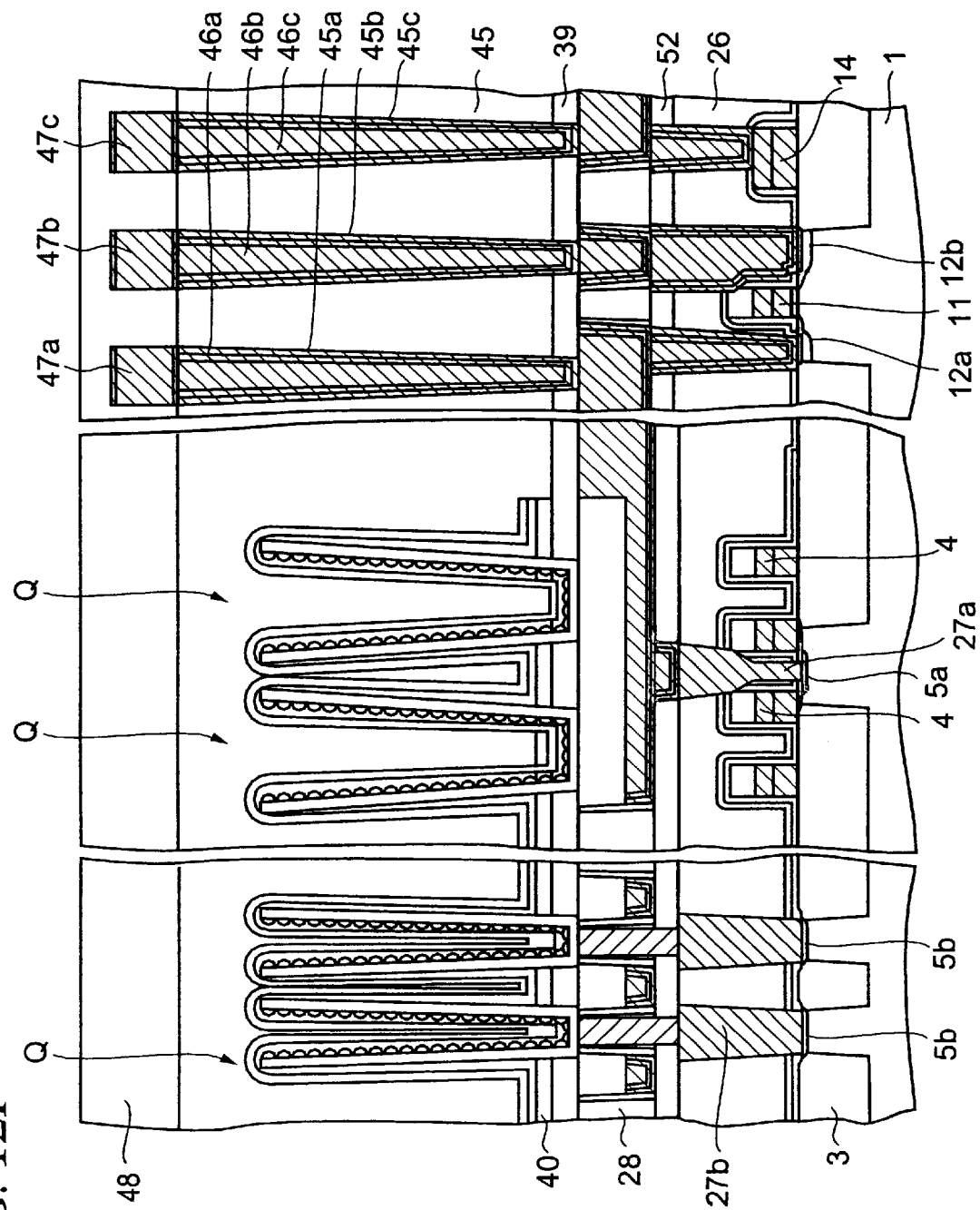

Next, steps required to get a configuration shown in FIGS. 12I and 12J will be explained hereunder.

First, the third interlayer insulating film 39 is formed on the storage contact plugs 38, the fourth silicon nitride film 35, and the $SiO_2$ film 49. Then, the fifth silicon nitride film 40 is formed on the third interlayer insulating film 39, and then the capacitors Q are formed by the same method as the first embodiment.

Then, the fourth interlayer insulating film 45 covering the capacitors Q is formed by the same method as the first embodiment, then the upper contact holes 45a to 45c are formed in the third and fourth interlayer insulating films 39, 45 in the peripheral circuit region B, then the plugs 46a to 46c are formed in the contact holes 45a to 45c, then the wirings 47a to 47c are formed on the fourth interlayer insulating film 45, and then the protection insulating film 48 covering the wirings 47a to 47c is formed. in the above semiconductor device, the wirings 6a, 13, 15 are formed in a plurality of wiring trenches 28e to 28g that are formed in the second interlayer insulating film 28 to have substantially equal depths. Then, the upper portions of the bit lines 6 are selectively etched to reduce their thickness, and then the fourth silicon nitride film 35 is formed on the thinned bit line 6.

Accordingly, there is no necessity to form the etching stopper layer (silicon nitride film), that is used to differentiate the depths of a plurality of wiring trenches 28e to 28g in the memory cell region A and the peripheral circuit region B, between the first interlayer insulating film 26 and the second interlayer insulating film 28. In addition, the step of selectively etching the etching stopper layer is not needed and thus the reduction in throughput can be prevented.

Since the wirings 6a, 13, 15 in the peripheral circuit region B do not have the structure in which the same conductive film is formed by two separate steps, no contact interface except the triple-layered structure exists in the same conductive film and thus the higher resistance of the conductive film is not caused.

Moreover, since the fourth silicon nitride film 35 covering the bit line 6 in the memory cell region A is buried only in the upper portion of the wiring trench 28e, the upper surface of the fourth silicon nitride films 35 is substantially equal in height to the upper surfaces of the wirings 6a, 13, 15 in the peripheral circuit region B. Thus, since heights of upper surfaces of the storage contact holes 37 that are formed between the bit lines 6 by the self-align contact are set equal to heights of the wirings 6a, 13, 15 in the peripheral circuit region B, the storage contact holes 37 do not become higher than the wirings 6a, 13, 15. Therefore, the coverage of the conductive film that is buried in the storage contact holes 37 as the plugs 38 can be improved.

Besides, since the fourth silicon nitride film 35 formed on the bit lines 6 is formed after the pattern formation and the film thickness adjustment of the bit lines 6 and the wirings 6a, 13, 15 have been completed, there is no necessity that the patterning of the fourth silicon nitride film 35 and the patterning of the bit lines 6 and the wirings 6a, 13, 15 should be carried out successively. Thus, the tapering-off of the bit lines 6 due to the over-etching is not caused. Accordingly, the pattern precision of the bit lines 6 that are formed thinner than the wirings 6a, 13, 15 in the peripheral circuit region B can be improved.

In the fourth embodiment, like the second and third embodiments, there may be employed the structure that the first to third wirings 6a, 13, 15 in the peripheral circuit region B are covered with the insulating film when the fourth silicon nitride film 35 buried in the wiring trench 28e in which the bit line 6 is formed is CMP-polished.

Fifth Embodiment

Figure 13:
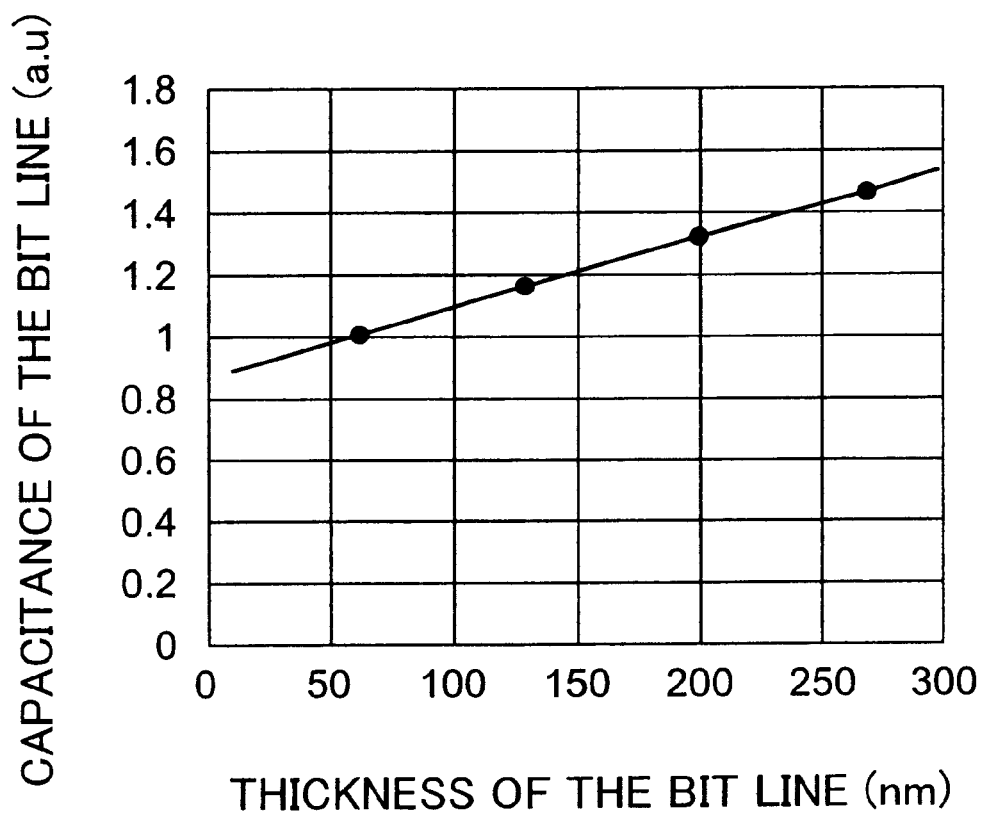
FIG. 13 is a graph showing a relationship between a thickness of a bit line film and a capacitance of a bit line in the embodiment of the present invention.

In the above embodiments, the film thickness of the bit lines 6 in the memory cell region A is formed thinner than the wirings 6a, 13, 15 in the peripheral circuit region B. Then, as shown in FIG. 13, the bit-line capacitance is reduced smaller as the thickness of the bit lines 6 is reduced smaller.

In the peripheral circuit region B, there are portions in which coupling capacitance between the wirings should be reduced by reducing partially the thickness of the wirings between the elements. For example, in the bootstrap circuit or the power-supply generator, a generation efficiency of the power supply can be increased by reducing the parasitic capacitance between the wirings. Also, mainly the resistance determines a delay time of the oscillator in the high-speed operation portion of the oscillator, but the consumption power can be reduced in the low power portion by reducing the parasitic capacitance between the wirings.

Figure 14:
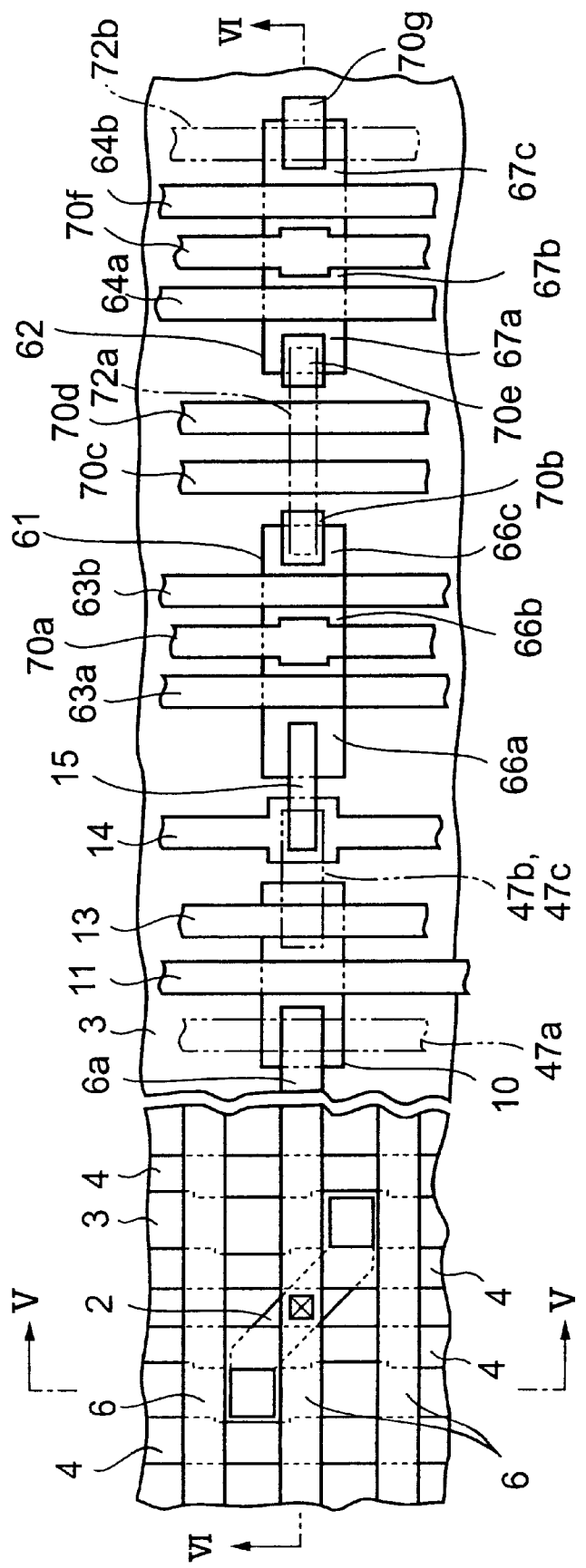
FIG. 14 is a plan view showing a semiconductor device according to a fifth embodiment of the present invention.
Figure 15:
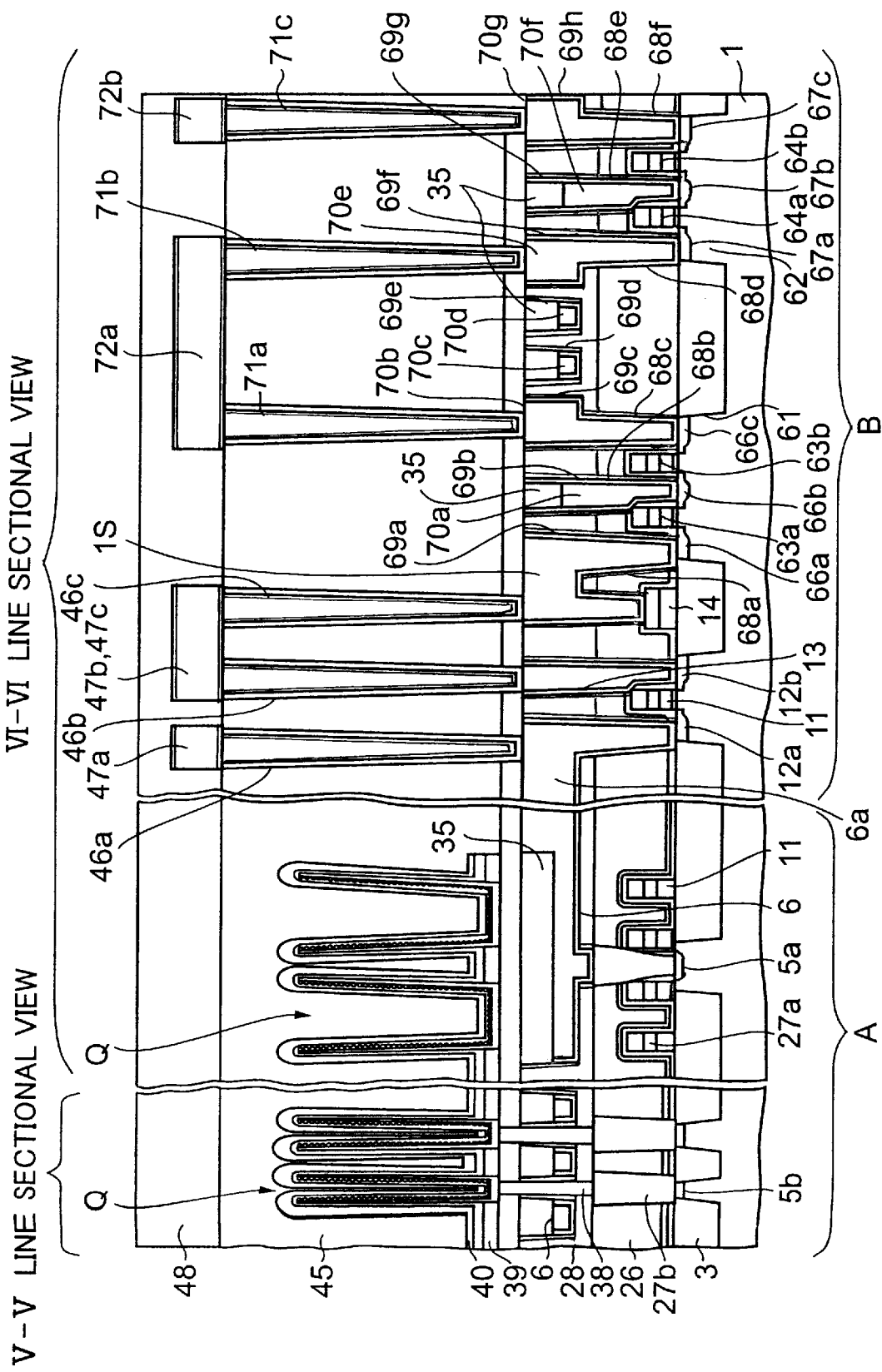
FIG. 15 is a sectional view showing the semiconductor device according to the fifth embodiment of the present invention.

FIG. 14 is a plan view showing a semiconductor device in which the peripheral circuit region B shown in FIG. 8 is further expanded, and the same references as those in FIG. 8 denote the same elements. FIG. 15 is a sectional view taken along a V—V line and a VI—VI line in FIG. 14, and the same references as those in FIG. 9M denote the same elements.

In FIG. 14 and FIG. 15, the memory cell region A has the same configuration as the first embodiment. Also, in FIG. 14 and FIG. 15, in the peripheral circuit region B, second and third active regions 61, 62 as well as the active region 10 shown in the first embodiment are surrounded by the device isolation insulating film 3.

Two gate electrodes 63a, 63b and 64a, 64b are formed on the second and third active regions 61, 62 via a gate insulating film (not shown) respectively. Also, impurity diffusion layers 66a to 66c, 67a to 67c having the LDD structure are formed on both sides of the gate electrodes 63a, 63b and 64a, 64b in the second and third active regions 61, 62 respectively. Accordingly, two MOS transistors are formed in the second and third active regions 61, 62 respectively.

These MOS transistors are covered with the first interlayer insulating film 26 shown in the first embodiment.

In the first and second interlayer insulating films 26, 28 in the peripheral circuit region B, contact holes 68a to 68f are formed on the impurity diffusion layers 66a to 66c, 67a to 67c respectively. In addition, wiring trenches 69a to 69h passing over the contact holes 68a to 68f are formed on the second interlayer insulating film 28. These wiring trenches 69a to 69h are formed by the same steps as the wiring trenches 28e to 28g shown in the first embodiment to have the same depths. Bottom surfaces of all wiring trenches 28e to 28g, 69a to 69h have the substantially equal height from the upper surface of the silicon substrate 1.

Also, wirings 70a to 70g having the same structure as the first to third wirings 6a, 13, 15 shown in the first embodiment are formed in the wiring trenches 69a to 69h newly shown in the peripheral circuit region B. A part of these wirings 70a to 70g constituting the bootstrap circuit, the power-supply generator, and the oscillator is thinned like the bit lines 6, and then the fourth silicon nitride film 35 shown in the first embodiment is formed on the wirings 70a to 70g.

In FIG. 15, references 71a to 71c denote plugs that are formed in the fourth interlayer insulating film 45 and electrically connected to the impurity diffusion layers 66c, 67a, 67c in the peripheral circuit region B. References 72a, 72b denote second-layer wirings that are formed on the fourth interlayer insulating film in the peripheral circuit region B and connected to the plugs.

In the above peripheral circuit region B, since a part of the wirings 70a to 70g in the wiring trenches 69a to 69h formed in the second interlayer insulating film 28 in the above peripheral circuit region B is thinned, the reduction in the parasitic capacitance between the wirings can be achieved.

In the peripheral circuit region B, it is preferable that thinned portions of the wirings 70a, 70b, 70c, 70d, 70f should be portions to which the plugs 71a to 71c formed in the fourth interlayer insulating film 45 are not connected. This is because the contact holes in which the plugs 71a to 71c are buried can be easily formed without the change of the etchant.

Other Embodiments

In the semiconductor devices according to the above embodiments, tungsten is mainly applied as material constituting the bit lines and the wirings. But copper, aluminum, a double-layered structure of silicide/polysilicon, and other conductive materials may be employed.

Also, in the semiconductor devices according to the above embodiments, insulating materials such as silicon oxynitride, that can selectively etched with respect to the silicon oxide, may be employed in place of the silicon nitride formed on the bit lines.

In addition, in the above semiconductor devices, the storage electrode 42 of the capacitor Q connected to the storage contact plugs 38, 38a in the memory cell region A may be formed of metal. For example, the storage electrode 42 may be formed of platinum, ruthenium, ruthenium oxide, or strontium ruthenate. If the ruthenium oxide is used as the storage electrode, oxide such as barium strontium titanate (BST), strontium titanate (STO), tantalum oxide, PZT, etc., for example, may be employed as the dielectric film 43. Also, the same material as the storage electrode 42 may be employed as the opposing electrode 44.

Furthermore, in the above embodiments, the CMP method is employed to remove the conductive film constituting the bit lines 6, and the wirings 6a, 13, 15 from the second interlayer insulating film 28. But the etching-back may also be employed.

As described above, according to the present invention, the depth of the first wiring trenches formed in the first region of the first insulating film formed on the semiconductor substrate is set equal to the depth of the second wiring trenches formed in the second region, and the film thickness of the first wirings buried in the first wiring trenches is set thinner than that of the second wirings buried in the second wiring trenches, and the second insulating film is formed on the thinned first wirings.

Accordingly, there is no necessity to differentiate the depths of a plurality of wiring trenches in the first region and the second region. Thus, the formation of the etching stopper layer and the etching to change the depths of the wiring trenches can be omitted and thus the reduction in throughput can be prevented.

Also, since the film thickness of the first wirings formed in the first wiring trenches and the film thickness of the second wirings formed in the second wiring trenches can be adjusted by thinning the first wirings, there is no need to form twice the same conductive film in the second wiring trenches by separate steps. Thus, generation of the contact interface can be suppressed and thus the increase in resistance of the second wirings can be prevented.

Further, since the second insulating film covering the first wirings in the first region is buried only in the upper portions of the first wiring trenches, the upper surfaces of the second insulating film are substantially equal in height to the upper surfaces of the second wirings in the second region. Thus, the upper surfaces of the holes formed between a plurality of first wirings in the self-alignment manner can be set equal in height to the upper surfaces of the second wirings in the second region. Therefore, the holes can be formed shallow and thus the coverage of the conductive film buried in the holes as the plugs can be improved.

Moreover, after the pattern formation and the film thickness adjustment of the first wirings and the second wirings have been completed, the second insulating film formed on the first wirings can be formed. Therefore, it is not needed that the patterning of the second insulating film and the patterning of the first and second wirings should be carried out successively. Thus, the tapering-off of the first wirings due to the over-etching is not caused. As a result, the pattern precision of the first wirings that are formed thin can be improved.

What is claimed is:

1. A semiconductor device comprising:
a transistor consisting of a gate electrode formed on a first region of a semiconductor substrate via a gate insulating film, and a first impurity diffusion layer and a second impurity diffusion layer formed in the semiconductor substrate both sides of the gate electrode;
a conductive pattern formed in a second region of the semiconductor substrate;
a first insulating film formed above the transistor and the conductive pattern over the semiconductor substrate;
a first wiring trench formed in the first insulating film at a position higher than the transistor in the first region;
a second wiring trench formed in the first insulating film in the second region to have a substantially same depth as the first wiring trench;
a first hole formed in the first insulating film under the first wiring trench and above the first impurity diffusion layer of the transistor;
a first wiring buried in lower portion of the first wiring trench and connected electrically to the first impurity diffusion layer via the first hole;
a second insulating film buried in upper portion of the first wiring trench and formed of material different from the first insulating film; and
a second wiring formed of same conductive material as the first wiring in the second wiring trench, and formed thicker than the first wiring, and connected electrically to the conductive pattern.

2. A semiconductor device according to claim 1, wherein the first region is a memory cell region, the first wiring is a bit line, the second region is a peripheral circuit region, and the conductive pattern is a third impurity diffusion layer in the semiconductor substrate or a lower wiring above the semiconductor substrate.

3. A semiconductor device according to claim 1, wherein the second wiring trench is connected to the first wiring trench.

4. A semiconductor device according to claim 1, wherein a third wiring trench is formed in the first insulating film in the second region, and a third wiring having a same thickness as the first wiring is buried in lower portion of the third wiring trench.

5. A semiconductor device according to claim 1, wherein the first insulating film is formed of silicon oxide or impurity-containing silicon oxide, and the second insulating film is formed of silicon nitride or silicon oxynitride.

6. A semiconductor device according to claim 1, wherein the second insulating film is also formed on the second wiring in the second wiring trench.

7. A semiconductor device according to claim 1, wherein a third insulating film, that covers the second wiring and is formed of material different from the second insulating film, is formed on the first insulating film in the second region, and the second insulating film is formed not only in the first wiring trench but also on the first insulating film in the first region to have a same thickness as the third insulating film.

8. A semiconductor device according to claim 1, wherein the first wiring trench is formed in plural in the first region, a second hole is formed in the first interlayer insulating film above the second impurity diffusion layer of the transistor between the first wiring trench, and a conductive plug is buried in the second hole.

9. A semiconductor device according to claim 8, wherein a capacitor having a lower electrode that is connected electrically to the conductive plug in the second hole is formed on the first insulating film.

10. A semiconductor device according to claim 8, wherein a third hole into which conductive material is buried is formed under the second hole.

11. A semiconductor device according to claim 1, wherein a fourth hole into which conductive material is buried is formed between the first hole and the first impurity diffusion layer.

* * * * *